United States Patent
Wu et al.

(10) Patent No.: US 12,550,565 B2
(45) Date of Patent: Feb. 10, 2026

(54) DISPLAY PANEL AND DISPLAY APPARATUS

(71) Applicant: Hubei Yangtze Industrial Innovation Center Of Advanced Display Co., Ltd., Wuhan (CN)

(72) Inventors: Fengyun Wu, Wuhan (CN); Yangzhao Ma, Wuhan (CN); Meihong Wang, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 0 days.

(21) Appl. No.: 18/743,062

(22) Filed: Jun. 13, 2024

(65) Prior Publication Data
US 2024/0341142 A1    Oct. 10, 2024

(30) Foreign Application Priority Data
Oct. 11, 2023 (CN) .......................... 202311315817.3

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01); *G09G 2300/0819* (2013.01)

(58) Field of Classification Search
CPC ........... H10K 59/00–95; H10K 59/131; G09G 2300/0426; G09G 2310/061; G09G 2310/062; G09G 2310/063; G06F 3/0412
See application file for complete search history.

(56) References Cited

U.S. PATENT DOCUMENTS

| | | | | |
|---|---|---|---|---|
| 2021/0225983 A1* | 7/2021 | Wu | ...................... | H10K 59/131 |
| 2022/0077265 A1* | 3/2022 | Ma | ...................... | H10K 59/1213 |
| 2023/0238326 A1* | 7/2023 | Hua | ................... | H01L 23/5286 |
| | | | | 257/773 |

FOREIGN PATENT DOCUMENTS

| | | |
|---|---|---|
| CN | 113809098 A | 12/2021 |
| CN | 115394821 A | 11/2022 |

\* cited by examiner

*Primary Examiner* — Sanjiv D. Patel
(74) *Attorney, Agent, or Firm* — Wiersch Law Group

(57) ABSTRACT

A display panel and a display apparatus are provided. The display panel includes: a display region, a non-display region, power lines, and power buses. The display region includes first sub-regions and second sub-regions, the first sub-regions and the second sub-regions are arranged along a first direction, and the second sub-region is located between the first sub-region and the non-display region. The power lines are located in the display region, and include first power lines extending along a second direction and arranged in a same layer. The power buses are located in the non-display region. The first power lines include first power sub-lines and second power sub-lines. The first power sub-lines are connected to the power bus. Breaks are formed between the second power sub-lines and the power buses. At least one of the second power sub-lines is located in the first sub-region.

12 Claims, 43 Drawing Sheets

DISPLAY PANEL AND DISPLAY APPARATUS

CROSS-REFERENCE TO RELATED APPLICATIONS

The present application claims priority to Chinese Patent Application No. 202311315817.3, filed on Oct. 11, 2023, the content of which is incorporated herein by reference in its entirety.

FIELD

The present disclosure relates to the field of display technologies, and, particularly, to a display panel and a display apparatus.

BACKGROUND

With the continuous development of display technologies, users have increasingly high requirements for display panel performance in all aspects. However, the display panel in the related art has poor brightness uniformity, and cannot desirably meet requirements of users.

SUMMARY

In a first aspect, embodiments of the present disclosure provide a display panel. The display panel includes a display region, a non-display region, power lines, and power buses. The display region includes first sub-regions and second sub-regions. The first sub-regions and the second sub-regions are arranged along a first direction, and the second sub-region is located between one of the first sub-regions and the non-display region. The power lines are located in the display region, and include first power lines extending along a second direction and arranged in a same layer. The second direction intersects with the first direction. The power buses located in the non-display region. The first power lines include first power sub-lines and second power sub-lines. The first power sub-lines are connected to the power buses. Breaks are formed between the second power sub-lines and the power buses. At least one of the second power sub-lines is located in the first sub-region.

In a second aspect, embodiments of the present disclosure provide a display apparatus. The display apparatus includes a display panel. The display panel includes a display region, a non-display region, power lines, and power buses. The display region includes first sub-regions and second sub-regions. The first sub-regions and the second sub-regions are arranged along a first direction, and the second sub-region is located between one of the first sub-regions and the non-display region. The power lines are located in the display region, and include first power lines extending along a second direction and arranged in a same layer. The second direction intersects with the first direction. The power buses located in the non-display region. The first power lines include first power sub-lines and second power sub-lines. The first power sub-lines are connected to the power buses. Breaks are formed between the second power sub-lines and the power buses. At least one of the second power sub-lines is located in the first sub-region.

BRIEF DESCRIPTION OF DRAWINGS

In order to more clearly explain the embodiments of the present disclosure or the technical solution in the related art, the drawings to be used in the description of the embodiments or the related art will be briefly described below. The drawings in the following description are some embodiments of the present disclosure. For those skilled in the art, other drawings may further be obtained based on these drawings.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

Before the technical solutions in embodiments of the present disclosure are illustrated, a description is made first to problems in the related art.

A display panel uses a power bus to transmit a first power voltage to a power line. The first power voltage transmitted on the power line is written into a pixel circuit. Under a combined action of the first power voltage and a data voltage, the pixel circuit drives a light-emitting element to emit light.

Figure 1:
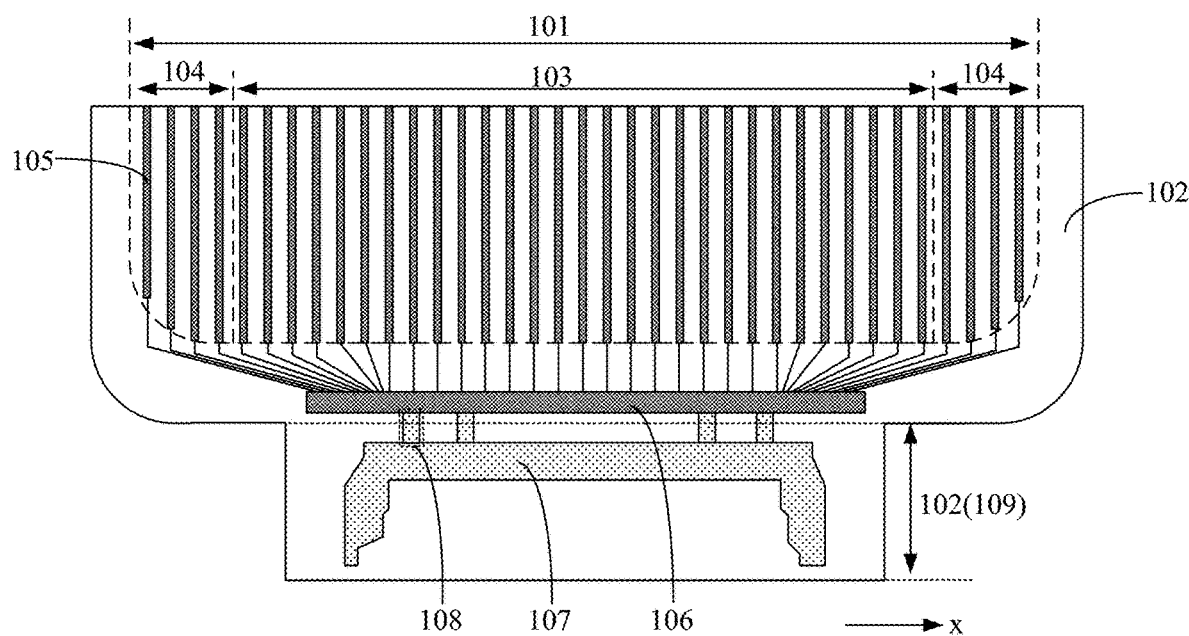
FIG. 1 is a partial structural schematic diagram of a display panel in the related art.

FIG. 1 is a partial structural schematic diagram of a display panel in the related art. According to a structural design of the existing display panel, as shown in FIG. 1, the display panel includes a display region 101 and a non-display region 102. The display region 101 includes an intermediate display region 103 and an edge display region 104. Two power buses that includes a first bus 106 and a second bus 107, are usually provided in the non-display region 102. The first bus 106 is adjacent to the display region 101 and is electrically connected to power lines 105 in the display region 101. The second bus 107 is adjacent to a pad (not shown in the drawings) and is connected to the pad. The first bus 106 is connected to the second bus 107 through a connection line 108, so as to realize signal transmission between the pad and the power lines 105.

The second bus 107 is short due to a short lower step 109 of the second bus 107 in a first direction x. The second bus 107 is only located under the intermediate display region 103. The connection line 108 between the second bus 107 and the first bus 106 is also only located under the intermediate display region 103. As such, when at least one of the power lines 105 in the intermediate display region 103 obtains a voltage, a transmission path of the voltage is short. Consequently, the intermediate display region 103 has excessively high brightness. A brightness difference is formed between the intermediate display region 103 and the edge display region 104, affecting display uniformity of the display panel.

Figure 2:
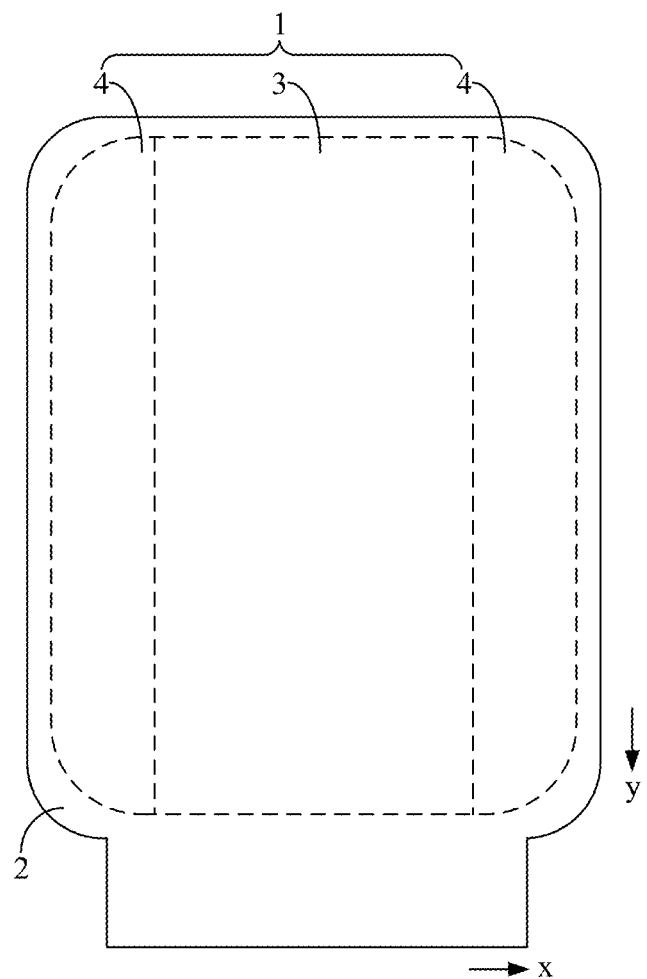
FIG. 2 is a schematic diagram showing region division of a display panel according to an embodiment of the present disclosure.
Figure 3:
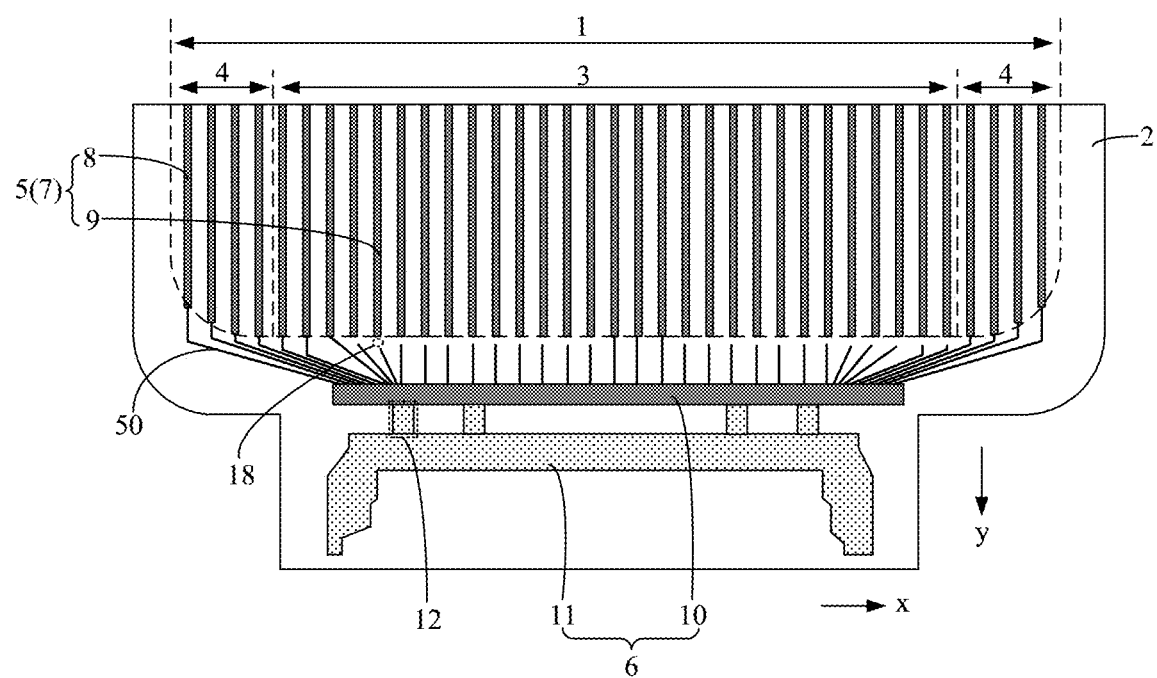
FIG. 3 is a partial structural schematic diagram of a display panel according to an embodiment of the present disclosure.

In view of the above problems, an embodiment of the present disclosure provides a display panel. FIG. 2 is a schematic diagram showing region division of a display panel according to an embodiment of the present disclosure. FIG. 3 is a partial structural schematic diagram of a display panel according to an embodiment of the present disclosure. As shown in FIG. 2 and FIG. 3, the display panel includes a display region 1 and a non-display region 2. The display region 1 includes a first sub-region 3 and a second sub-region 4. The first sub-region 3 and the second sub-region 4 are arranged along a first direction x. The second sub-region 4 is located between the first sub-region 3 and the non-display region 2. That is, the first sub-region 3 is an intermediate display region. The second sub-region 4 is an edge display region. The second sub-region 4 is located between the first sub-region 3 and a left border and/or a right border of the non-display region 2. In some embodiments of the present disclosure, the second sub-region 4 has a corner. At least one of edges of the second sub-region 4 is an arc edge.

Referring to FIG. 3, the display panel further includes a power line 5 and a power bus 6. The power line 5 is located in the display region 1. The power line 5 includes first power lines 7 extending along a second direction y and arranged in a same layer. The power bus 6 is located in the non-display region 2. The power line 5 and the power bus 6 are configured to transmit a first power voltage. The first power voltage may be a positive power voltage. The second direction y intersects with the first direction x.

The first power lines 7 include first power sub-lines 8 and second power sub-lines 9. The first power sub-lines 8 are connected to the power bus 6. Breaks 18 are formed between the second power sub-lines 9 and the power bus 6. At least one of the second power sub-lines 9 is located in the first sub-region 3.

It should be noted that the break 18 formed between the second power sub-line 9 and the power bus 6 refer to that the second power sub-line 9 is disconnected from the power bus 6, and the second power sub-line 9 is not directly connected to the power bus 6. However, referring to FIG. 22 and FIG. 23, the display panel includes pixel circuits 22. The pixel circuits 22 each include a storage capacitor C. The storage capacitor C includes a first plate c1. According to a layer structure of the existing display panel, the first plates c1 in multiple pixel circuits 22 arranged along the first direction x are connected to one another. A first structure 23 formed by multiple connected plates c1 is connected to the first power lines 7 to form a grid, thereby reducing an overall load of the power line 5. Although the second power sub-lines 9 are not directly connected to the power bus 6, a first power voltage transmitted on the power bus 6 can still be transmitted to the first structure 23 through the first power sub-lines 8, and then transmitted to the second power sub-lines 9 through the first structure 23. Therefore, the second power sub-lines 9 can still receive the first power voltage.

In the embodiments of the present disclosure, when the first power lines 7 are connected to the power bus 6, not all of the first power lines 7 are connected to the power bus 6, but at least one of the first power lines 7 in the intermediate display region is disconnected from the power bus 6. The first power line 7 disconnected in the intermediate display region does not directly obtain the first power voltage from the power bus 6, but obtains the first power voltage from the first structure 23 in the display region 1. This can lengthen a transmission path of the first power voltage, equilibrate the first power voltage transmitted on the first power line 7 in the intermediate display region, relieve the problem of excessively high brightness of a partial region in the intermediate display region due to a connection line under the intermediate display region, and improve brightness uniformity of the display panel.

In addition, it should be noted that the display panel in the embodiments of the present disclosure may be an organic light-emitting diode (OLED) display panel, e.g., it may be the OLED display panel using a low temperature polysilicon (LTPS), a low temperature polycrystalline oxide (LTPO), a flat screen, a foldable screen, etc.

In some embodiments of the present disclosure, referring to FIG. 3, the power bus 6 includes a first bus 10 and a second bus 11. The first bus 10 is located between the display region 1 and the second bus 11. The first bus 10 is electrically connected to the second bus 11 through a connection line 12. At least one of the breaks 18 is provided in an extending direction of the connection line 12 in the second direction y. That is, at least one of the breaks 18 is located above the connection line 12.

For the first power line 7 above the connection line 12, if the first power line 7 is connected to the first bus 10, the first power line 7 directly obtains the voltage at a line incoming position. The voltage has a short transmission path, and thus is excessively high. In view of this, at least one of the breaks 18 is formed at a side of the connection line 12 in the second direction y. That is, at least one of the first power lines 7 above the connection line 12 is designed as the second power sub-line 9, and disconnected from the first bus 10. This can eliminate an excessively high voltage on the first power line 7 in the intermediate display region, and further relieve the excessive high brightness of the intermediate display region.

Figure 4:
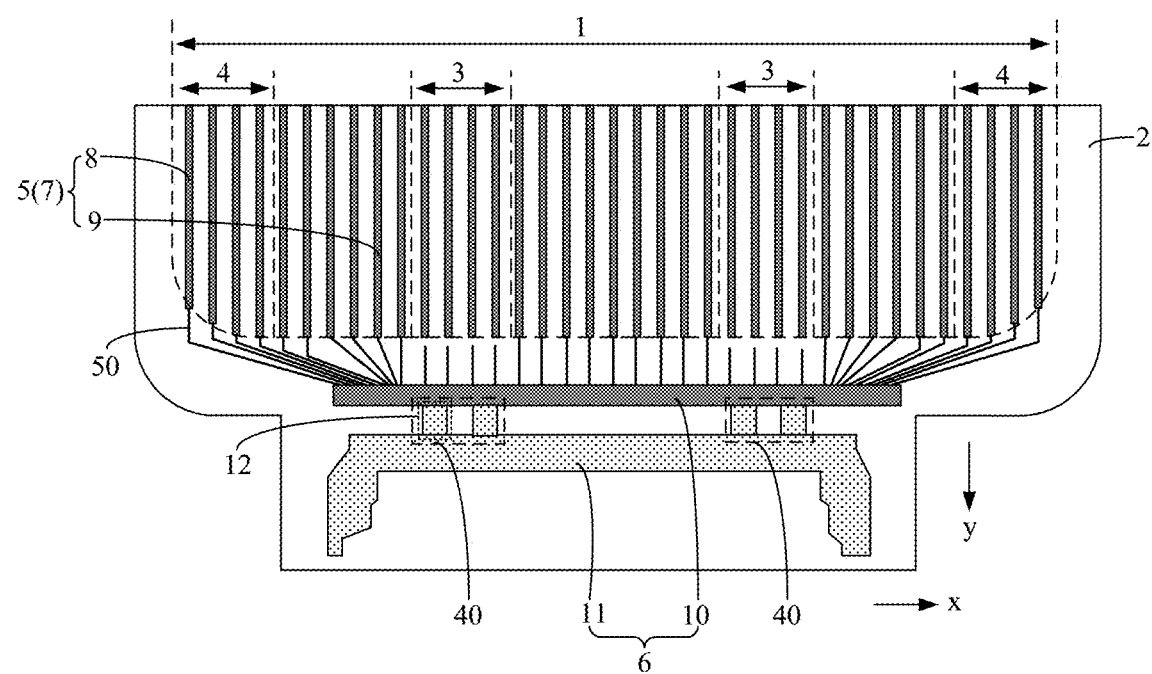
FIG. 4 is a partial structural schematic diagram of a display panel according to another embodiment of the present disclosure.

FIG. 4 is a partial structural schematic diagram of a display panel according to another embodiment of the present disclosure. In some embodiments of the present disclosure, as shown in FIG. 4, the power bus 6 includes a first bus 10 and a second bus 11. The first bus 10 is located between the display region 1 and the second bus 11. The first bus 10 is electrically connected to the second bus 11 through at least two line sets 40. The line sets 40 each include at least one connection line 12.

The display region includes at least two first sub-regions 3. Each of the first sub-regions 3 corresponds to one of the line sets 40. The first sub-region 3 is provided in an extending direction of the line set 40. That is, the first sub-region 3 is located above the line set 40.

In some embodiments of the present disclosure, as shown in FIG. 4, the first bus 10 is electrically connected to the second bus 11 through two line sets 40. The line sets 40 each include at least two connection lines 12. A distance between two line sets 40 is greater than a distance between adjacent connection lines 12 in the line set 40. In this case, the display region includes two first sub-regions 3. The two first sub-regions 3 are respectively located at sides of the two line sets 40 in the second direction y.

In such configuration, the display region 1 can be divided into at least two first sub-regions 4 according to positions of the line sets 40. This can achieve a targeted design of the second power sub-lines 9, and prevent excessively high brightness at the position of lines.

In addition, regarding the connection line, it is further found that based on an configuration manner of the connection line in the related art, the bottom display region of the display panel shows apparent brightness non-uniformity of "M-shape", and this aggravate the overall brightness non-uniformity, so that the brightness non-uniformity of the display panel is liable to be perceived by human eyes.

Referring to FIG. 1, there are usually four connection lines 108 in the display panel of the related art. The four connection lines 108 are respectively pairwise located at a left side and a right side under the intermediate display region. The voltage at the line incoming position is directly transmitted upward to the power line 105 through the connection line 108 and the first bus 106, and thus the voltage transmitted on the power line 105 above the line incoming position is excessively high.

Figure 5:
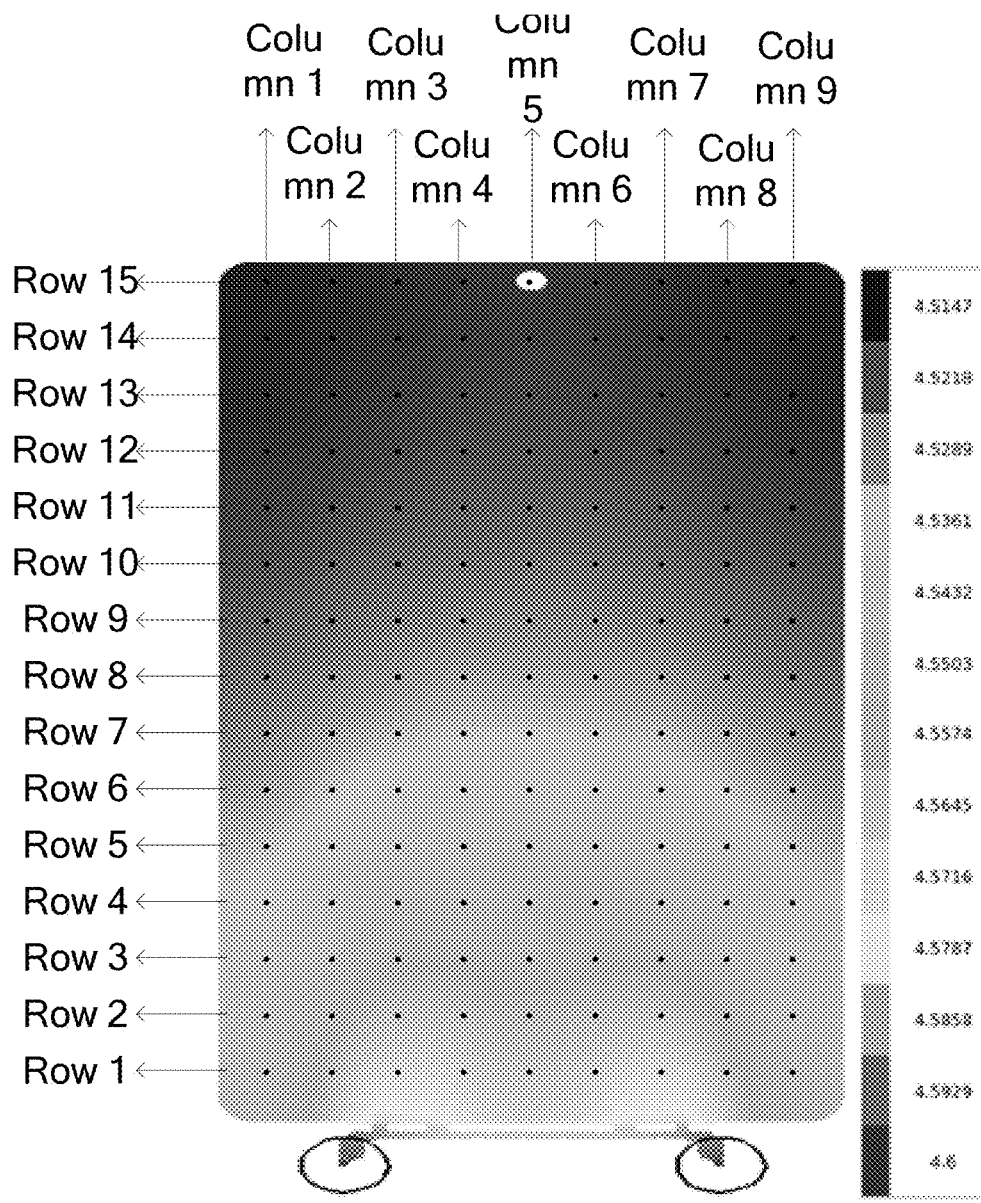
FIG. 5 is a schematic diagram showing a brightness distribution of a display panel in the related art.
Figure 6:
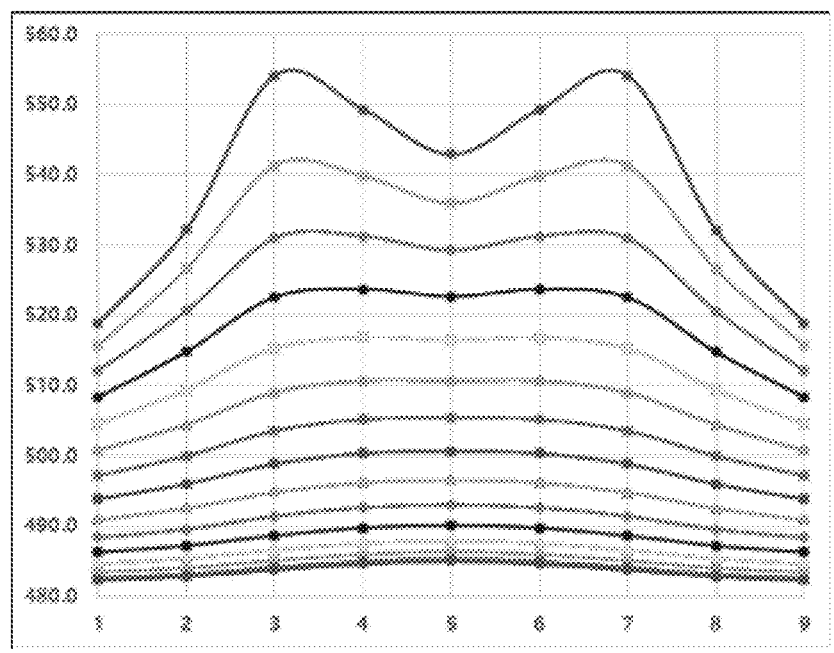
FIG. 6 is a schematic diagram showing a brightness distribution of 135 sub-pixels shown in FIG. 5 according to an embodiment of the present disclosure.

FIG. 5 is a schematic diagram showing a brightness distribution of a display panel in the related art. FIG. 6 is a schematic diagram showing a brightness distribution of 135 sub-pixels shown in FIG. 5. As shown in FIG. 5 and FIG. 6, 135 sub-pixels are selected in the display region 101. The 135 sub-pixels are arranged in 15 rows and 9 columns. Referring to FIG. 6 and Table 1, by detecting a brightness at the 135 sub-pixels, it can be seen that the region above the connection line 108, such as the sub-pixels at the third and seventh columns of the first row, and at the third and seventh columns of the second row, has excessively high brightness. Consequently, the bottom display region shows apparent brightness non-uniformity of "M-shape".

TABLE 1

|  | Column 1 | Column 2 | Column 3 | Column 4 | Column 5 | Column 6 | Column 7 | Column 8 | Column 9 |
|---|---|---|---|---|---|---|---|---|---|
| Row 1 | 518.9 | 532.3 | 554.2 | 549.4 | 542.9 | 549.4 | 554.1 | 532.1 | 518.8 |
| Row 2 | 515.8 | 526.7 | 541.4 | 539.9 | 536.0 | 539.9 | 541.3 | 526.6 | 515.7 |
| Row 3 | 512.2 | 520.7 | 531.1 | 531.4 | 529.3 | 531.3 | 531.0 | 520.6 | 512.2 |
| Row 4 | 508.5 | 514.9 | 522.7 | 523.8 | 522.8 | 523.8 | 522.6 | 514.8 | 508.4 |
| Row 5 | 504.6 | 509.5 | 515.4 | 516.9 | 516.5 | 516.9 | 515.4 | 509.4 | 504.6 |
| Row 6 | 500.9 | 504.5 | 509.1 | 510.7 | 510.7 | 510.7 | 509.1 | 504.5 | 500.8 |
| Row 7 | 497.3 | 500.1 | 503.7 | 505.3 | 505.4 | 505.2 | 503.6 | 500.0 | 497.2 |
| Row 8 | 494.0 | 496.1 | 498.9 | 500.4 | 500.7 | 500.4 | 498.9 | 496.0 | 493.9 |
| Row 9 | 491.0 | 492.6 | 494.9 | 496.3 | 496.6 | 496.2 | 494.9 | 492.6 | 491.0 |
| Row 10 | 488.5 | 489.6 | 491.5 | 492.7 | 493.1 | 492.7 | 491.5 | 489.6 | 488.4 |
| Row 11 | 486.4 | 487.3 | 488.8 | 489.8 | 490.2 | 489.8 | 488.7 | 487.3 | 486.4 |
| Row 12 | 484.7 | 485.5 | 486.7 | 487.6 | 488.0 | 487.6 | 485.4 | 484.7 |
| Row 13 | 483.5 | 484.1 | 485.2 | 486.1 | 486.4 | 486.1 | 485.2 | 484.1 | 483.5 |
| Row 14 | 482.7 | 483.3 | 484.2 | 485.1 | 485.5 | 485.1 | 484.2 | 483.2 | 482.7 |
| Row 15 | 482.4 | 482.9 | 483.8 | 484.7 | 485.1 | 484.7 | 483.8 | 482.9 | 482.4 |

Figure 7:
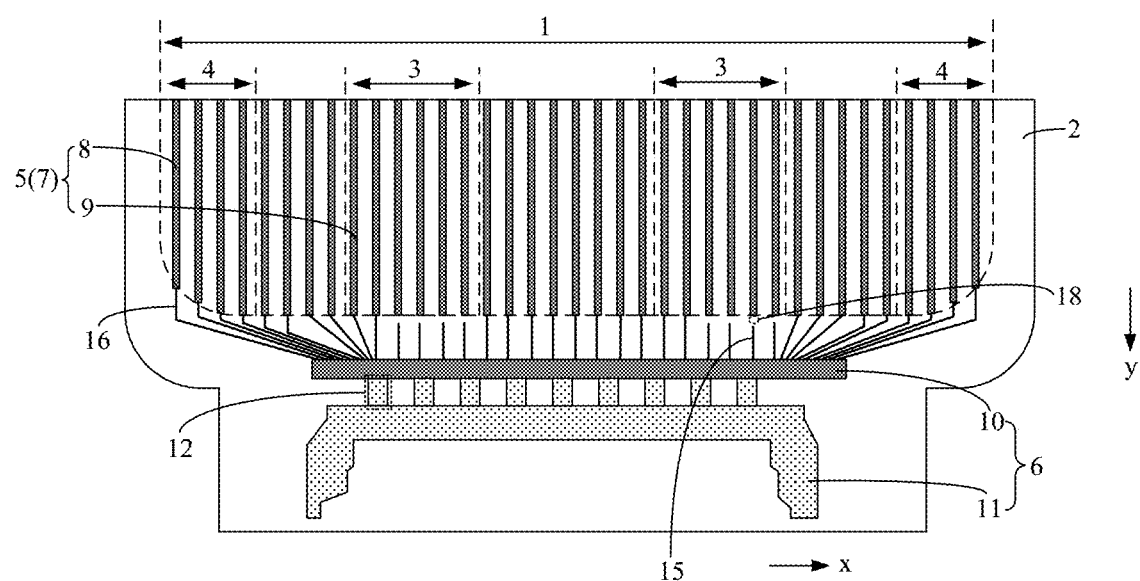
FIG. 7 is a partial structural schematic diagram of a display panel according to another embodiment of the present disclosure.

In view of this, in some embodiments of the present disclosure, as shown in FIG. 7, the power bus 6 includes a first bus 10 and a second bus 11. The first bus 10 is located between the display region 1 and the second bus 11. The first power sub-lines 8 are connected to the first bus 10. The breaks 18 are formed between the second power sub-lines 9 and the first bus 10, so that the second power sub-lines 9 are not directly connected to the power bus 6. FIG. 7 is a partial structural schematic diagram of a display panel according to another embodiment of the present disclosure. The first bus 10 is electrically connected to the second bus 11 through at least six connection lines 12.

Figure 8:
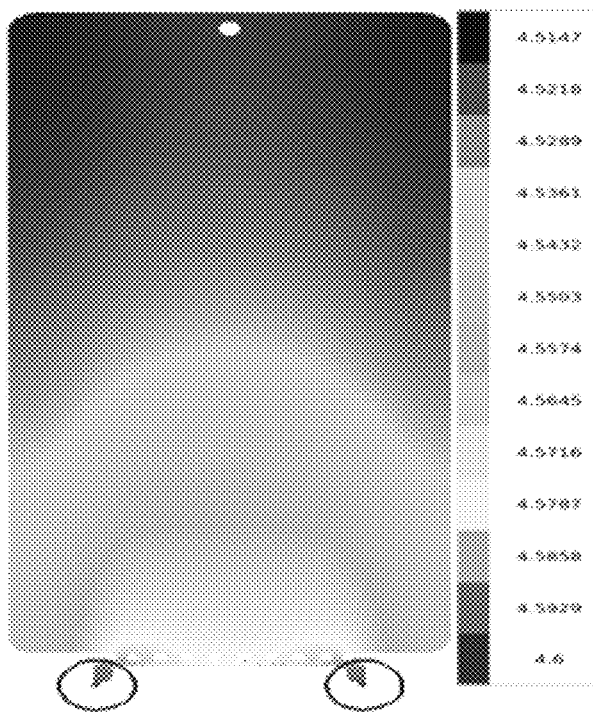
FIG. 8 is a schematic diagram showing a brightness distribution of a display panel according to an embodiment of the present disclosure.

Compared with a solution in which only four connection lines are provided at the left side and the right side under the intermediate display region in the related art, at least six connection lines 12 are provided between the first bus 10 and the second bus 11 in the embodiments of the present disclosure. FIG. 8 is a schematic diagram showing a brightness distribution of a display panel according to an embodiment of the present disclosure. As shown in FIG. 8, by increasing a number of the connection lines 12, voltages of the first power lines 7 at different positions in the intermediate display region are more uniform, the "M"-shape contour is weakened, and excessively high brightness in only two partial regions at a bottom of the intermediate display region is prevented.

Figure 9:
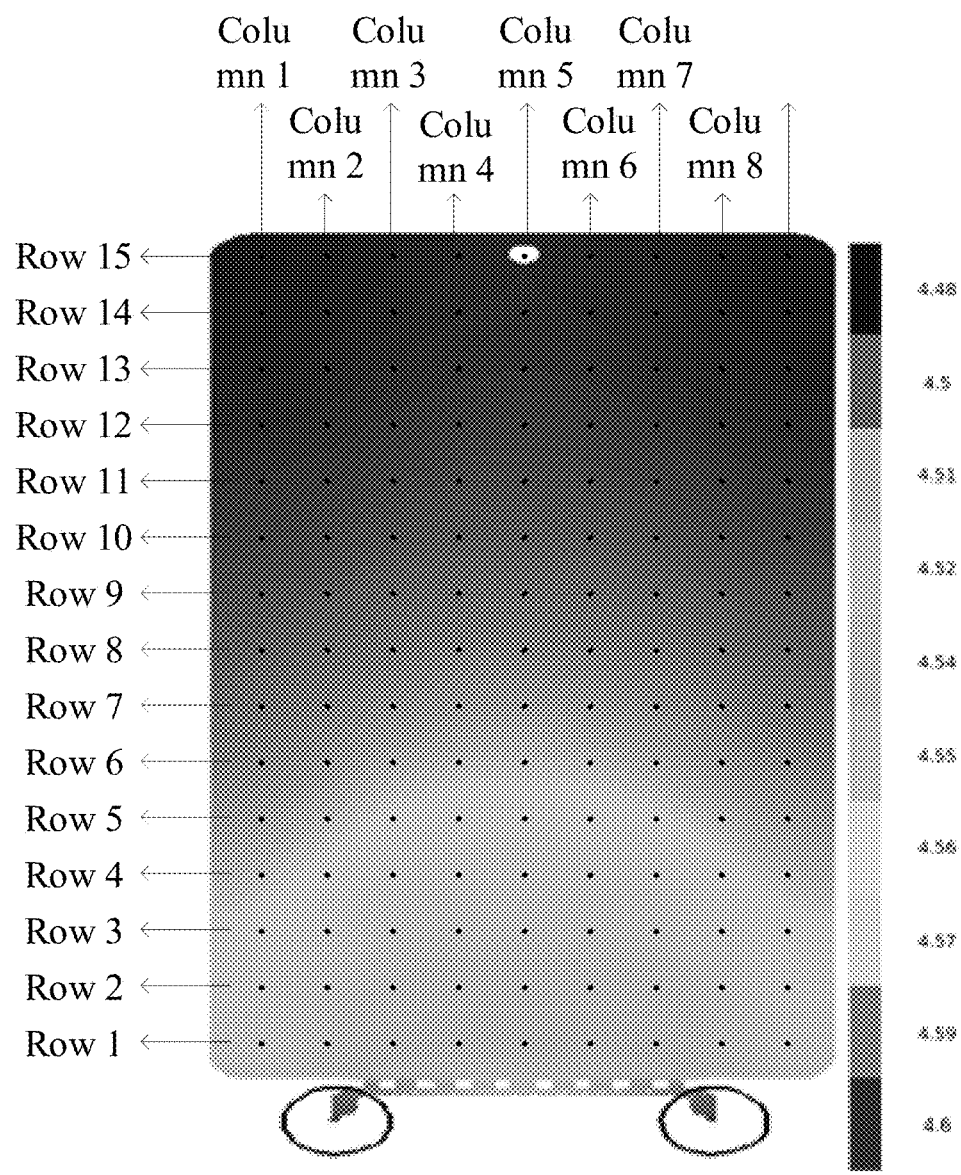
FIG. 9 is a schematic diagram showing a brightness distribution of a display panel according to another embodiment of the present disclosure.
Figure 10:
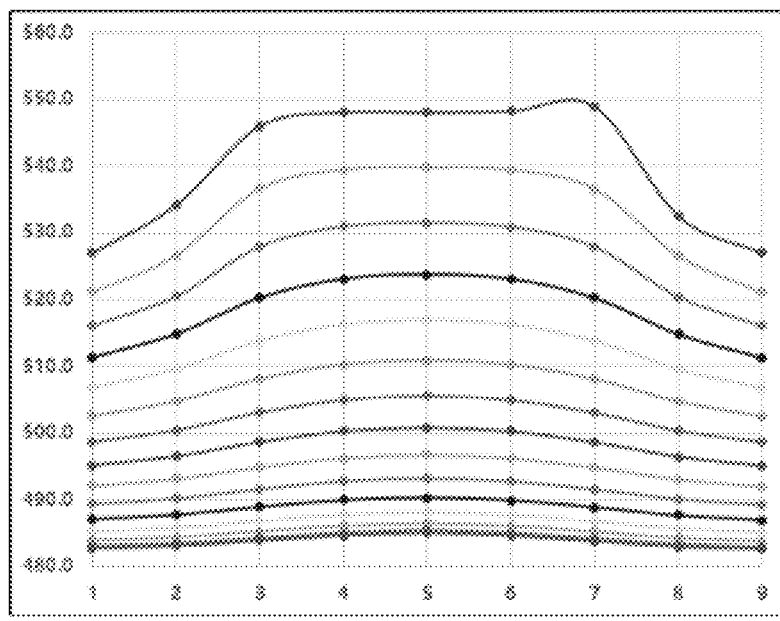
FIG. 10 is a schematic diagram showing a brightness distribution of 135 sub-pixels shown in FIG. 9 according to an embodiment of the present disclosure.

Particularly, in a solution in which the first sub-region 3 includes the second power sub-lines 9, when the first sub-region 3 is provided with the second power sub-lines 9 and at least six connection lines 12 are provided between the first bus 10 and the second bus 11, the second power sub-lines 9 can further reduce the overall brightness of the bottom intermediate display region, and thus the whole bottom intermediate display region has a smaller brightness difference. FIG. 9 is a schematic diagram showing a brightness distribution of a display panel according to another embodiment of the present disclosure. FIG. 10 is a schematic diagram showing a brightness distribution of 135 sub-pixels shown in FIG. 9. As shown in FIG. 9 and FIG. 10, 135 pixels are also selected in the display panel, and a brightness at the 135 pixels is detected. It can be seen from FIG. 10 and Table 2 that the brightness difference at different positions in the whole bottom display region is reduced, and the display region has better brightness uniformity. Compared with the related art, the brightness uniformity of the display panel in the embodiments of the present disclosure can be improved by about 0.9%.

TABLE 2

|  | Column 1 | Column 2 | Column 3 | Column 4 | Column 5 | Column 6 | Column 7 | Column 8 | Column 9 |
|---|---|---|---|---|---|---|---|---|---|
| Row 1 | 526.9 | 534.1 | 546.0 | 548.0 | 548.0 | 548.2 | 548.9 | 532.4 | 526.9 |
| Row 2 | 521.1 | 526.6 | 536.6 | 539.5 | 539.8 | 539.4 | 536.6 | 526.5 | 521.0 |
| Row 3 | 516.1 | 520.4 | 527.9 | 530.9 | 531.5 | 530.9 | 527.9 | 520.3 | 516.0 |
| Row 4 | 511.3 | 514.8 | 520.3 | 523.1 | 523.7 | 523.1 | 520.2 | 514.8 | 511.3 |
| Row 5 | 506.8 | 509.6 | 513.8 | 516.3 | 516.9 | 516.2 | 513.8 | 509.5 | 506.7 |
| Row 6 | 502.6 | 504.8 | 508.1 | 510.3 | 510.9 | 510.2 | 508.1 | 504.7 | 502.5 |
| Row 7 | 498.7 | 500.4 | 503.1 | 504.9 | 505.5 | 504.9 | 503.0 | 500.3 | 498.6 |
| Row 8 | 495.2 | 496.5 | 498.7 | 500.3 | 500.8 | 500.2 | 498.6 | 496.4 | 495.1 |
| Row 9 | 492.0 | 493.1 | 494.8 | 496.2 | 496.7 | 496.2 | 494.8 | 493.0 | 491.9 |
| Row 10 | 489.3 | 490.2 | 491.6 | 492.8 | 493.2 | 492.7 | 491.5 | 490.1 | 489.2 |
| Row 11 | 487.1 | 487.7 | 488.9 | 489.9 | 490.3 | 489.9 | 488.9 | 487.6 | 487.0 |
| Row 12 | 485.3 | 485.8 | 486.8 | 487.7 | 488.1 | 487.7 | 486.8 | 485.7 | 485.2 |
| Row 13 | 484.0 | 484.4 | 485.3 | 486.1 | 486.5 | 486.1 | 485.2 | 484.3 | 483.8 |
| Row 14 | 483.1 | 483.5 | 484.3 | 485.1 | 485.5 | 485.0 | 484.2 | 483.4 | 483.0 |
| Row 15 | 482.7 | 483.1 | 483.9 | 484.6 | 485.0 | 484.6 | 483.8 | 483.0 | 482.6 |

Further, referring to FIG. 7, when at least six connection lines 12 are provided between the first bus 10 and the second bus 11, the at least six connection lines 12 may be arranged at equal intervals. In this case, multiple line incoming positions are uniformly dispersed. This can further improve the brightness uniformity of the bottom display region of the display panel. And/or, the at least six connection lines 12 may further has a same line width. In this case, the loads of the connection lines 12 tends to be consistent, and the effect of different connection lines 12 on the voltage drop of the first power voltage tends to be consistent, thereby increasing the consistency of the first power voltage transmitted by the different connection lines 12, and further improving the brightness uniformity of the bottom display region of the display panel.

In some embodiments of the present disclosure, referring to FIG. 3, in the first sub-region 3, a number of the second power sub-lines 9 is greater than a number of the first power sub-lines 8. That is, more first power lines 7 in the first sub-region 3 are disconnected from the power bus 6, so that the excessively high brightness of the first sub-region 3 is further relieved, thereby reducing the brightness difference between the second sub-regions 4 at the two sides and the first sub-region 3 in the middle.

Figure 11:
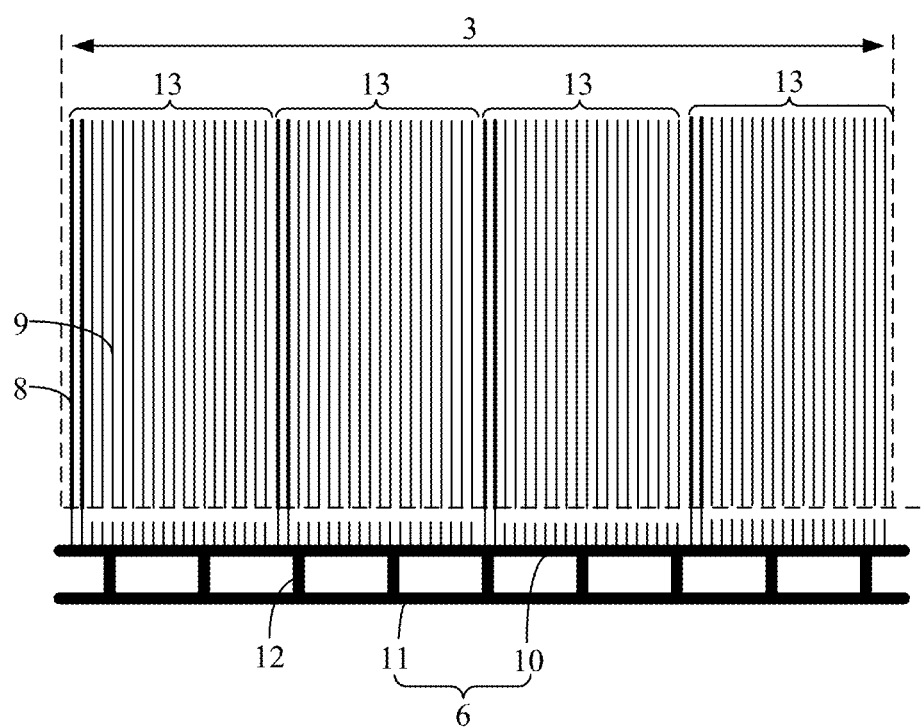
FIG. 11 is a partial structural schematic diagram of a display panel according to another embodiment of the present disclosure.

FIG. 11 is a partial structural schematic diagram of a display panel according to another embodiment of the present disclosure. In some embodiments of the present disclosure, as shown in FIG. 11, the first sub-region 3 includes multiple first wiring sets 13. The first wiring sets 13 each include m1 first power sub-lines 8 and n1 second power sub-lines 9, m1≥1 and m1+n1≥10.

The first power sub-lines 8 and the second power sub-lines 9 in the first sub-region 3 are arranged regularly and repeatedly in the wiring sets. In this case, the first power sub-lines 8 connected to the power bus 6 are uniformly dispersed in the whole first sub-region 3, and the first power sub-lines 8 at multiple positions can receive the first power voltage from the power bus 6 simultaneously, so that the first power voltage can be transmitted more quickly through the first structure 23 to the second power sub-lines 9 disconnected from the power bus 6.

Moreover, there are ten or more first power lines 7 in the first wiring set 13. This ensures that the single first wiring set 13 includes an enough number of the first power lines 7, and the first wiring set 13 includes an enough number of the second power sub-lines 9, thereby significantly relieving the excessively high brightness of the middle display region.

Further, $2 \leq m1 \leq 4$. In some embodiments of the present disclosure, m=2.

If m1=1, only one first power line 7 in the first wiring set 13 is connected to the power bus 6. This will cause current concentration and a large current density on the first power line 7, so that a risk of damage the first power line 7 is increased by static electricity, affecting a connection reliability between the power bus 6 and the first power line 7. If $m1 \geq 5$, there is a small number of the first power lines 7 disconnected from the power bus 6 in the first wiring set 13, so that the brightness in the intermediate display region is not relieved significantly. Therefore, in the embodiments of the present disclosure, $2 \leq m1 \leq 4$. This not only can improve the connection reliability between the power bus 6 and the first power sub-line 8, but also can effectively control the brightness in the intermediate display region.

Further, $m1+n1 \leq 20$. In some embodiments of the present disclosure, $m1+n1=20$.

By further providing $m1+n1 \leq 20$, the single first wiring set 13 does not include a large number of the first power lines 7. Therefore, more first wiring sets 13 can be separated in the first sub-region 3, and the first power sub-lines 8 connected to the power bus 6 are more dispersed in the whole first sub-region 3.

Figure 12:
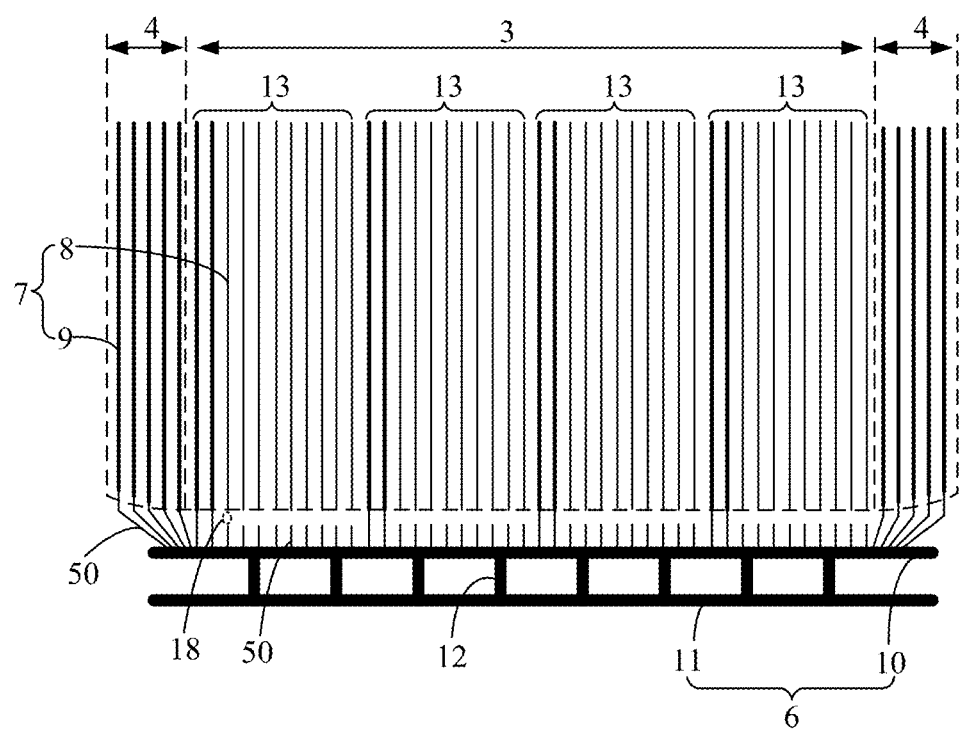
FIG. 12 is a partial structural schematic diagram of a display panel according to another embodiment of the present disclosure.
Figure 13:
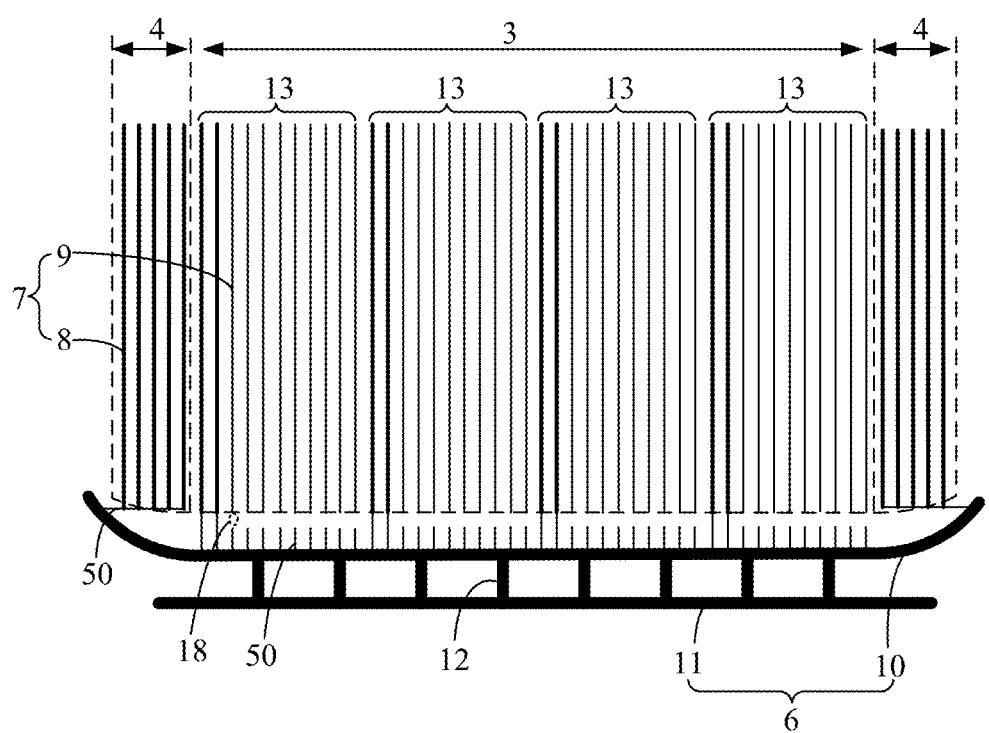
FIG. 13 is a partial structural schematic diagram of a display panel according to another embodiment of the present disclosure.
Figure 14:
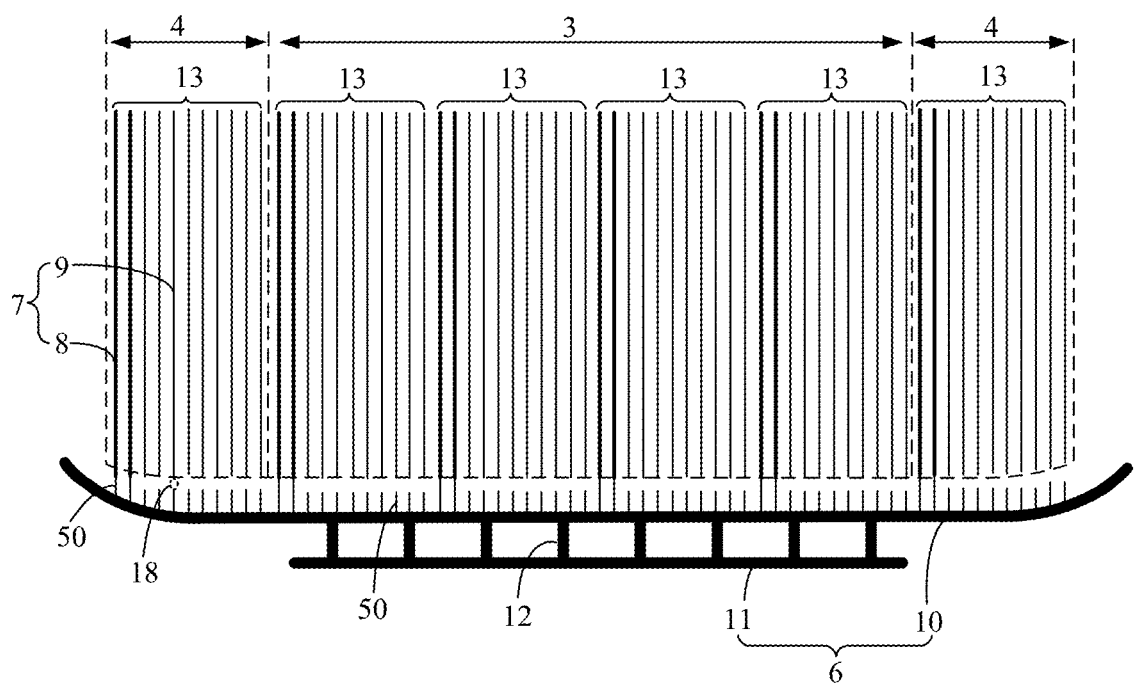
FIG. 14 is a partial structural schematic diagram of a display panel according to another embodiment of the present disclosure.

In the embodiments of the present disclosure, referring to FIG. 12 to FIG. 14, the display panel may further include fan-out lines 50. At least one of the fan-out lines 50 is connected between the first power sub-line 8 and the first bus 10. The break 18 is formed between at least one of the fan-out lines 50 and the second power sub-line 9 and/or the first bus 10. The break 18 refers to the break 18 formed between the second power sub-line 9 and the first bus 10.

FIG. 12 is a partial structural schematic diagram of a display panel according to another embodiment of the present disclosure. FIG. 13 is a partial structural schematic diagram of a display panel according to another embodiment of the present disclosure. In some embodiments of the present disclosure, as shown in FIG. 12 and FIG. 13, the second sub-region 4 includes only the first power sub-lines 8. That is, all of the first power lines 7 in the second sub-region 4 are directly connected to the power bus 6.

In some structures of the display panel, the fan-out lines 50 corresponding to the first power lines 7 in the second sub-region 4 have a greater extending length. For example, in the panel structure shown in FIG. 12, the first bus 10 extends under the first sub-region 3 along the first direction x, and the fan-out lines 50 corresponding to the first power lines 7 in the second sub-region 4 are bent or inclined to be connected to the first bus 10. Or, in some structures of the display panel shown in FIG. 13, the first bus 10 further extends to the underside of the second sub-region 4, and the fan-out lines 50 corresponding to the first power lines 7 in the second sub-region 4 transversely extend to the first bus 10 along the first direction x.

In this type of panel structures, the fan-out lines 50 corresponding to the first power lines 7 in the second sub-region 4 have a greater extending length. When the first power lines 7 in the second sub-region 4 and the first sub-region 3 are connected to the first bus 10 through the fan-out lines 50, the second sub-region 4 is relatively dark due to the fan-out lines 50. For this, all of the first power lines 7 in the second sub-region 4 are designed to be the first power sub-lines 8 in the embodiments of the present disclosure. In other words, the second power sub-lines 9 disconnected from the first bus 10 are not provided in the second sub-region 4, so that the darkness of the second sub-region 4 is not aggravated due to the second power sub-lines 9 in the second sub-region 4, thereby improving the brightness uniformity of the first sub-region 3 and the second sub-region 4.

FIG. 14 is a partial structural schematic diagram of a display panel according to another embodiment of the present disclosure. In some embodiments of the present disclosure, as shown in FIG. 14, the second sub-region 4 includes at least one first wiring set 13. That is, the first power lines 7 in the second sub-region 4 are arranged in a same pattern as the first power lines 7 in the first sub-region 3.

In other panel structures, there is a little difference between extending lengths of the fan-out lines 50 corresponding to the first power lines 7 in the second sub-region 4 and the first sub-region 3. For example, in the panel structure shown in FIG. 14, the first bus 10 further extends to an underside of the second sub-region 4, and the fan-out lines 50 corresponding to the first power lines 7 in the second sub-region 4 still longitudinally extend to the first bus 10 along the second direction y. In this case, the fan-out lines 50 corresponding to the first power lines 7 in the whole display region 1 have a similar length.

In these panel structures, when the first power lines 7 in the second sub-region 4 and the first sub-region 3 are connected to the first bus 10 through the fan-out lines 50, the second sub-region 4 is not dark due to the fan-out lines 50. Therefore, in some embodiments of the present disclosure, the second sub-region 4 may also include at least one first wiring set 13, and the first power lines 7 in the whole display region 1 are arranged in a same cycle. For the display panels with a same number of the first power lines 7, the first power lines 7 may be applied with a same arrangement manner, thereby achieving a simple design.

In addition, it should be noted that the design with the second sub-region 4 including only the first power sub-lines 8 is not limited to the panel structure shown in FIG. 12 and the panel structure shown in FIG. 13. The design can also be applied to other panel structures, for example, the panel structure shown in FIG. 14 in which the first bus 10 further extends to the underside of the second sub-region 4, and the fan-out lines 50 corresponding to the first power lines 7 in the second sub-region 4 still longitudinally extend to the first bus 10 along the second direction y. Likewise, the design with the second sub-region 4 including at least one first wiring set 13 is not limited to the panel structure shown in FIG. 14. The design can also be applied to other panel structures, for example, the panel structure shown in FIG. 12 in which the first bus 10 extends under the first sub-region 3 along the first direction x, and the fan-out lines 50 corresponding to the first power lines 7 in the second sub-region 4 are bent or inclined to be connected to the first bus 10, or, the panel structure shown in FIG. 13 in which the first bus 10 further extends to the underside of the second sub-region 4, and the fan-out lines 50 corresponding to the first power lines 7 in the second sub-region 4 transversely extend to the first bus 10 along the first direction x.

Figure 15:
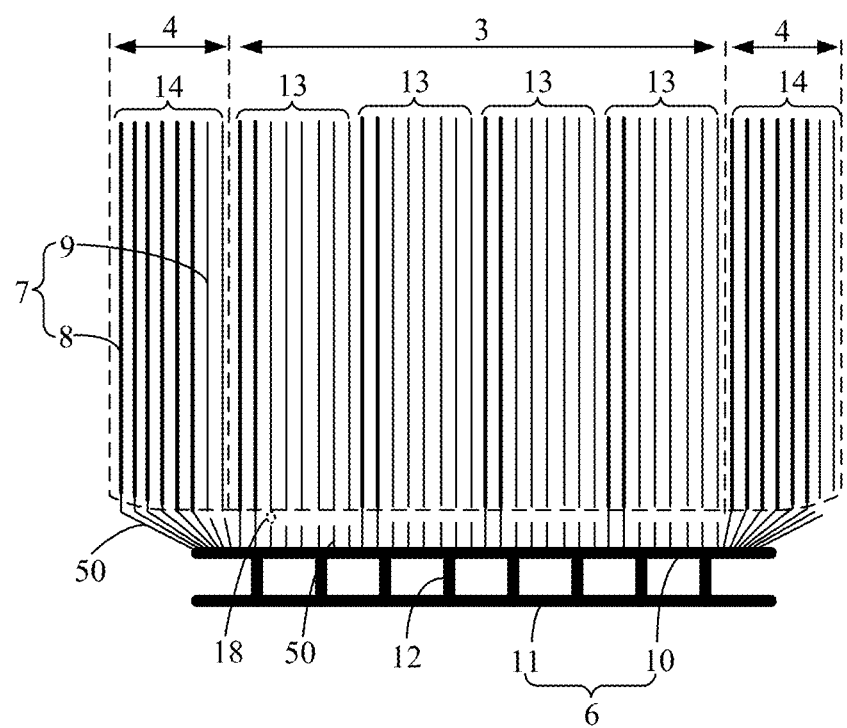
FIG. 15 is a partial structural schematic diagram of a display panel according to another embodiment of the present disclosure.

FIG. 15 is a partial structural schematic diagram of a display panel according to another embodiment of the present disclosure. In some embodiments of the present disclosure, as shown in FIG. 15, the second sub-region 4 includes at least one second wiring set 14. The second wiring set 14 includes m2 first power sub-lines 8 and n2 second power sub-lines 9, m2+n2=m1+n1 and m2>m1.

For the first sub-region 3 and the second sub-region 4 with the same number of the first power lines 7, in case of a larger number of the first power sub-lines 8 in the first power lines 7 in the second sub-region 4, namely a larger number of the first power lines 7 directly connected to the power bus 6. Regardless of a length difference between the fan-out lines 50 corresponding to the first power lines 7 in the first sub-region 3 and the second sub-region 4, the brightness of the edge display region is not reduced significantly due to the large number of the second power sub-lines 9 in the second sub-region 4.

Figure 16:
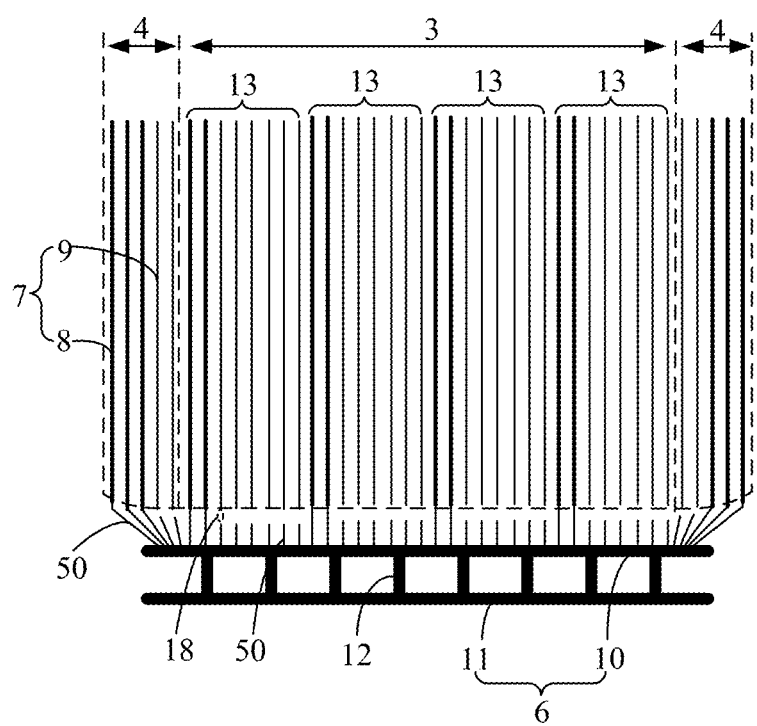
FIG. 16 is a partial structural schematic diagram of a display panel according to another embodiment of the present disclosure.

FIG. 16 is a partial structural schematic diagram of a display panel according to another embodiment of the present disclosure. In some embodiments of the present disclosure, as shown in FIG. 16, the second sub-region 4 includes the first power sub-lines 8 and the second power sub-lines 9. In the second sub-region 4, in order not to significantly reduce the brightness of the edge display region due to a great number of the second power sub-lines 9 in the second sub-region 4, a number of the first power sub-lines 8 is greater than a number of the second power sub-lines 9 in the second sub-region 4.

In some embodiments of the present disclosure, referring to FIG. 16, the second sub-region 4 includes the first power sub-lines 8 and the second power sub-lines 9. In the second sub-region 4, the second power sub-lines 9 are respectively located at a side of the first power sub-line 8 adjacent to the first sub-region 3, so that the excessive high brightness in the vicinity of the intermediate display region can be avoided by using the second power sub-lines 9.

In some embodiments of the present disclosure, referring to FIG. 12 to FIG. 16, the display panel further includes fan-out lines 50 in the non-display region 2. The break 18 is formed between at least one of the fan-out lines 50 and the second power sub-line 9 and/or is formed between at least one of the fan-out lines 50 and the first bus 10. The break 18 refers to the break 18 formed between the second power sub-line 9 and the first bus 10.

Although the second power sub-line 9 is not directly connected to the power bus 6, the fan-out line 50 is still provided corresponding to the second power sub-line 9 in the embodiments of the present disclosure, so that an overall pattern of the fan-out lines 50 can be uniform in the lower border, thereby improving the etching uniformity in the manufacturing process.

Referring to FIG. 16, it should be noted that in a structure of the display panel, at least one of the fan-out lines 50 only corresponds to the second power sub-line 9. The break 18 is formed between the fan-out lines 50 and the corresponding second power sub-line 9 and/or the first bus 10. The remaining fan-out lines of the fan-out lines 50 corresponds only to the first power sub-line 8, and remaining fan-out lines of the fan-out lines 50 are connected to the first power sub-line 8 and the first bus 10.

Figure 17:
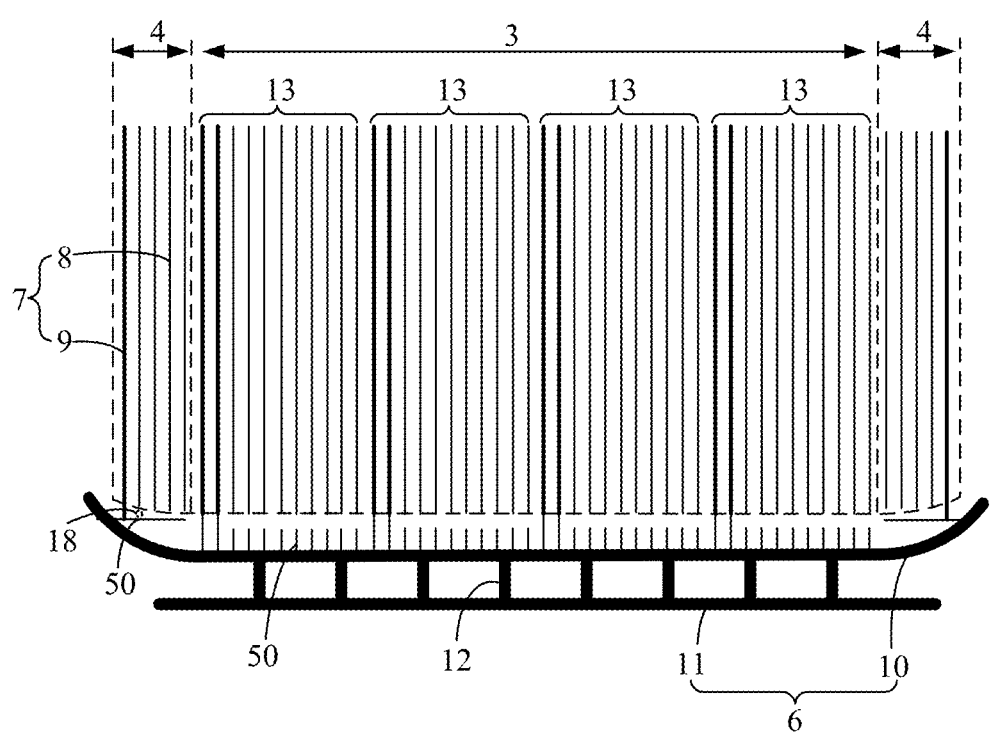
FIG. 17 is a partial structural schematic diagram of a display panel according to another embodiment of the present disclosure.

FIG. 17 is a partial structural schematic diagram of a display panel according to another embodiment of the present disclosure. In another structure of the display panel, as shown in FIG. 17, a part of the fan-out lines 50 corresponds to the second power sub-line 9 and the first power sub-line 8 simultaneously. This part of fan-out lines 50 is connected to the corresponding first power sub-line 8 and the corresponding first bus 10, and the break 18 is formed between the fan-out lines 50 and the corresponding second power sub-line 9.

Figure 18:
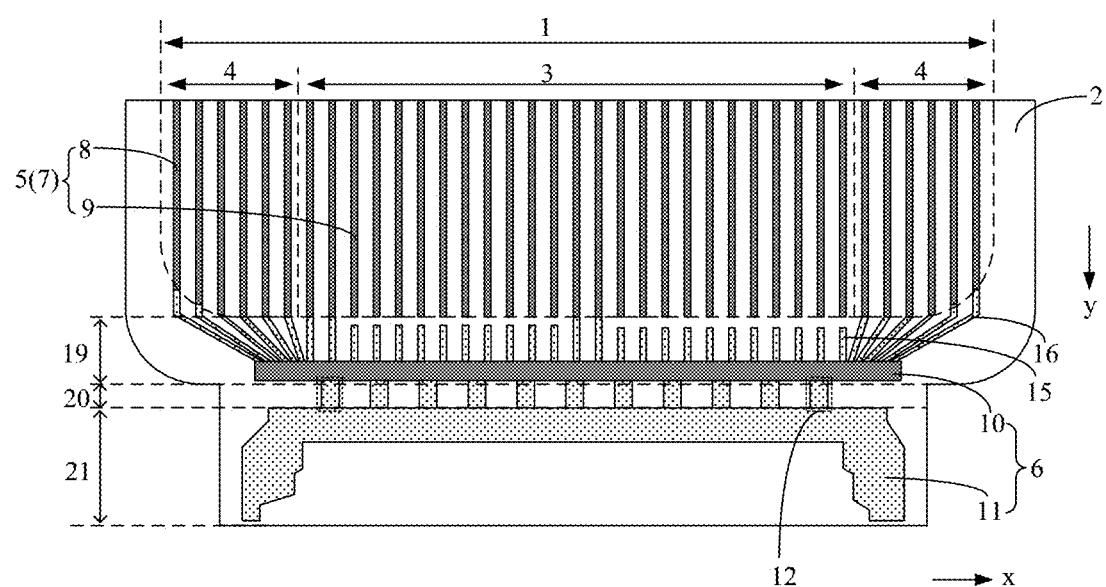
FIG. 18 is a partial structural schematic diagram of a display panel according to another embodiment of the present disclosure.
Figure 19:
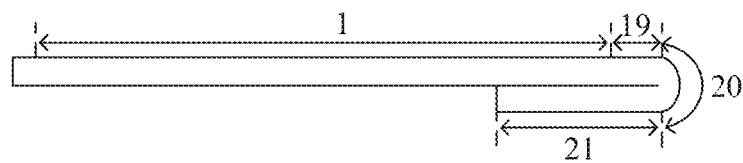
FIG. 19 is a side view of a display panel according to an embodiment of the present disclosure.

FIG. 18 is a partial structural schematic diagram of a display panel according to another embodiment of the present disclosure. FIG. 19 is a side view of a display panel according to an embodiment of the present disclosure. It should be noted that as shown in FIG. 18 and FIG. 19, the non-display region 2 includes a first non-display region 19, a second non-display region 20, and a third non-display region 21. The first non-display region 19 is the lower border of the display panel. The second non-display region 20 is a bending region. The second non-display region 20 drives the third non-display region 21 to bend to a backlight side of the display panel.

In some embodiments of the present disclosure, at least a part of the fan-out lines 50 and the first bus 10 may be located in the first non-display region 19. At least a part of connecting lines is located in the second non-display region 20. The second bus 11 is located in the third non-display region 21. Since the third non-display region 21 bends to the backlight side of the display panel, when a user faces the display panel, the third non-display region 21 is invisible to human eyes. Therefore, a width of the second bus 11 can be increased to be greater than a width of the first bus 10, so that when the second bus 11 receives a voltage from a pad, a current density on the second bus 11 can be reduced, thereby reducing the risk of its damage by electric current.

Figure 20:
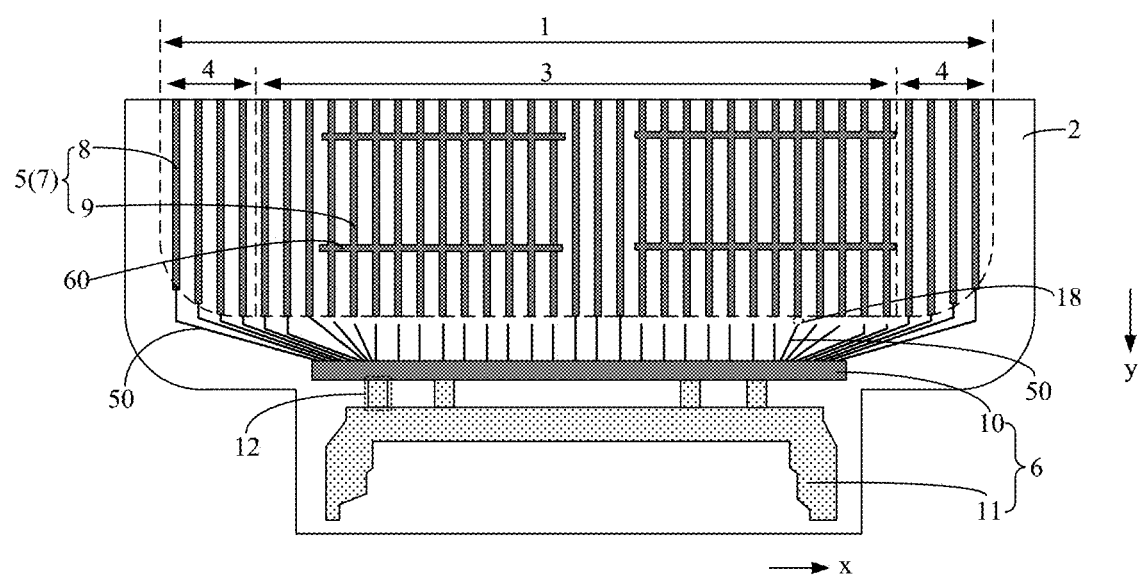
FIG. 20 is a partial structural schematic diagram of a display panel according to another embodiment of the present disclosure.

FIG. 20 is a partial structural schematic diagram of a display panel according to another embodiment of the present disclosure. In some embodiments of the present disclosure, as shown in FIG. 20, adjacent ones of the second power sub-lines 9 are further electrically connected through a connecting segment 60 extending along the first direction x, so that the load of the second power sub-line 9 is reduced, thereby avoiding excessively low brightness of the first sub-region 3 caused by the second power sub-line 9.

In some embodiments of the present disclosure, the connecting segment 60 may be provided in a same layer as the second power sub-line 9. Moreover, the second power sub-line 9 is provided in a different layer from other signal lines such as a data line extending in a same direction as the second power sub-line.

Figure 21:
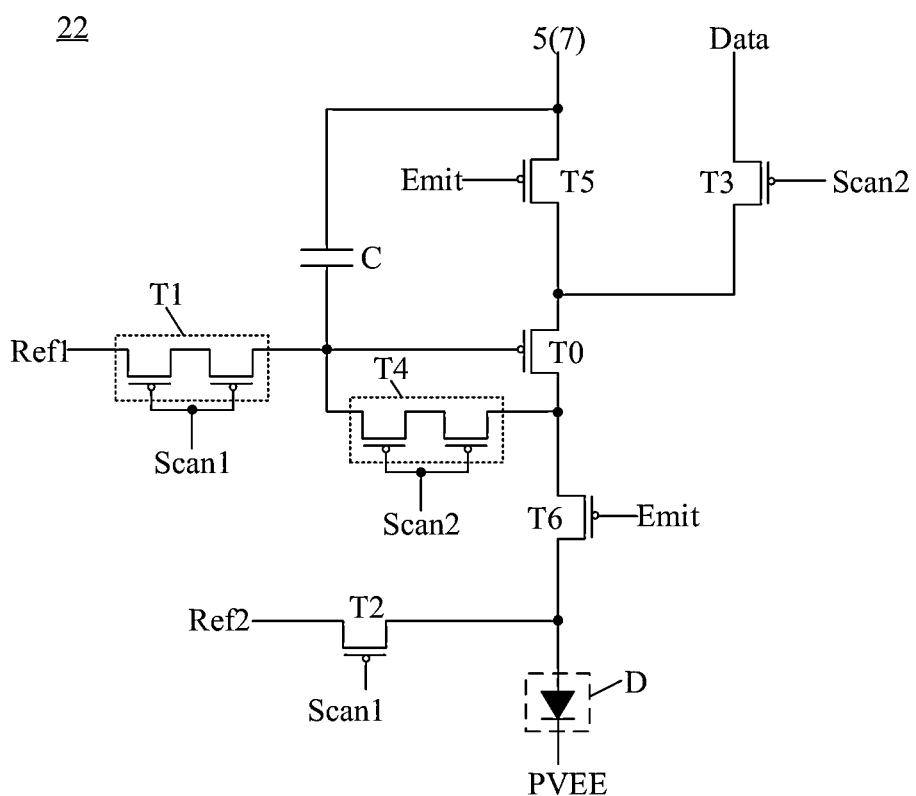
FIG. 21 is a structural schematic diagram of a pixel circuit according to an embodiment of the present disclosure.
Figure 22:
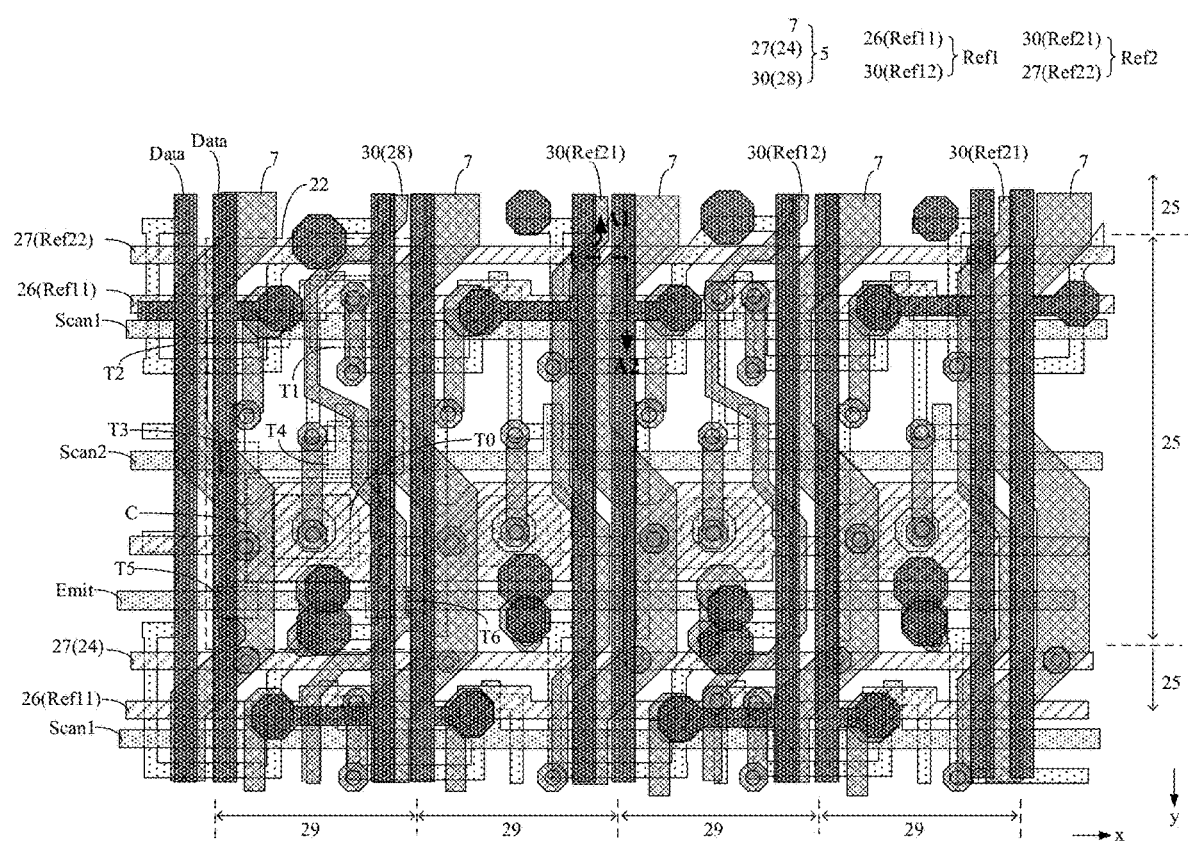
FIG. 22 is a structural schematic diagram of layers of a display panel according to an embodiment of the present disclosure.
Figure 23:
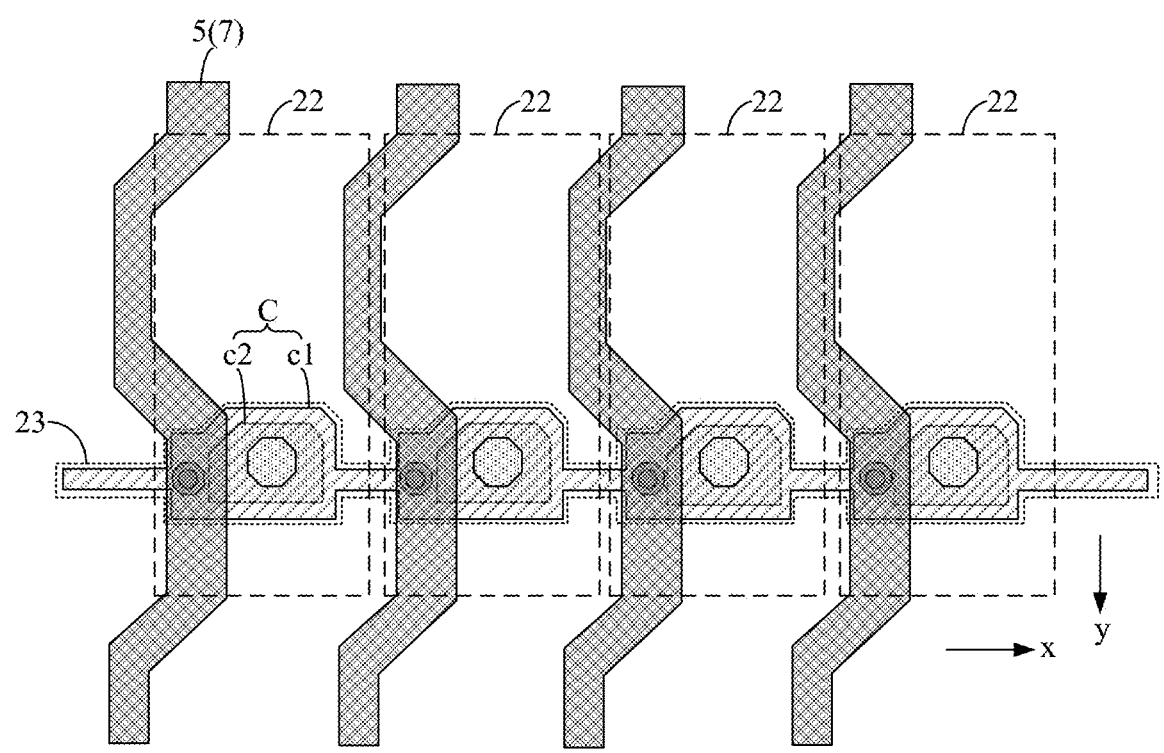
FIG. 23 is a partial structural schematic diagram of layers shown in FIG. 22 according to an embodiment of the present disclosure.

FIG. 21 is a structural schematic diagram of a pixel circuit 22 according to an embodiment of the present disclosure. FIG. 22 is a structural schematic diagram of layers of a display panel according to an embodiment of the present disclosure. FIG. 23 is a partial structural schematic diagram of layers shown in FIG. 22. In some embodiments of the present disclosure, as shown FIG. 21 to FIG. 23, the display panel further includes pixel circuits 22. The pixel circuits 22 each include a storage capacitor C. The storage capacitor C includes a first plate c1 and a second plate c2.

The first plates c1 in multiple pixel circuits 22 arranged along the first direction x are connected to each other to form a first structure 23. The first structure 23 is electrically connected to the first power lines 7 to form a grid, thereby reducing an overall load of the power line 5. Although the second power sub-lines 9 in the first power lines 7 are not directly connected to the power bus 6, the second power sub-lines 9 in the first power lines 7 can still obtain the first power voltage from the first structure 23.

Figure 24:
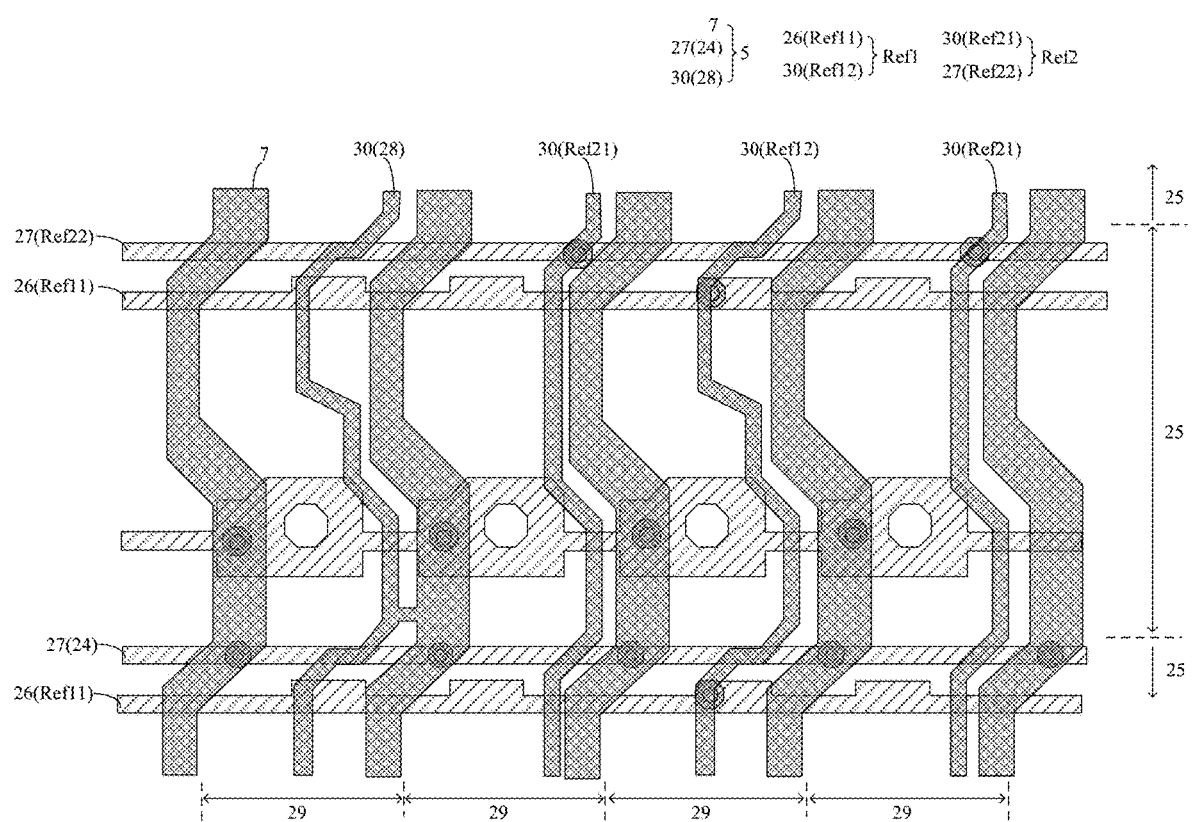
FIG. 24 is a partial structural schematic diagram of layers shown in FIG. 22 according to an embodiment of the present disclosure.

FIG. 24 is another partial structural schematic diagram of layers shown in FIG. 22. In some embodiments of the present disclosure, referring to FIG. 21, FIG. 22 and FIG. 24, the display panel further includes pixel circuits 22. The pixel circuits 22 are respectively electrically connected to a first reset line for providing a first reset voltage and a second reset line Ref2 for providing a second reset voltage.

The first reset line includes a first reset sub-line Ref11 extending along the first direction x. The second reset line Ref2 includes a second reset sub-line Ref21 extending along the second direction y.

The power line 5 further second power lines 24. The second power lines 24 are respectively electrically connected to the first power lines 7. The second power line 24 extends along the first direction x and is provided in a same layer as the first reset sub-line Ref11. The display panel includes multiple pixel rows 25 arranged along the second direction y. The pixel rows 25 each include multiple pixel circuits 22 arranged along the first direction x. The pixel row 25 corresponds to a first wiring 26 and a second wiring 27 that are provided in a same layer and are adjacent to each other. The first wiring 26 corresponding to the pixel row 25 is the first reset sub-line Ref11. The second wiring 27 corresponding to at least one of the pixel rows 25 is the second power line 24.

And/or, the power line 5 further includes third power lines 28. The third power lines 28 are respectively electrically connected to the first power lines 7. The third power line 28 extends along the second direction y and is provided in a same layer as the second reset sub-line Ref21. The display panel includes multiple pixel columns 29 arranged along the first direction x. The pixel columns 29 each include multiple pixel circuits 22 arranged along the second direction y. The pixel column 29 corresponds to a third wiring 30. The third wiring 30 corresponding to at least one of the pixel columns 29 is the second reset sub-line Ref21. The third wiring 30 corresponding to at least one of the pixel columns 29 is the third power line 28.

It can be understood that the pixel circuit 22 is required to receive a reset voltage to reset a gate of a driving transistor T0 and an anode of a light-emitting element D. In such configuration manner, the pixel circuit 22 can respectively reset the gate of the driving transistor T0 and the anode of the light-emitting element D by using two different reset voltages. In this case, the driving transistor T0 and the light-emitting element D can be reset more flexibly. For example, the voltage for resetting the anode of the light-emitting element D can be set lower, so as to better avoid accidental light emission of the sub-pixel.

Figure 25:
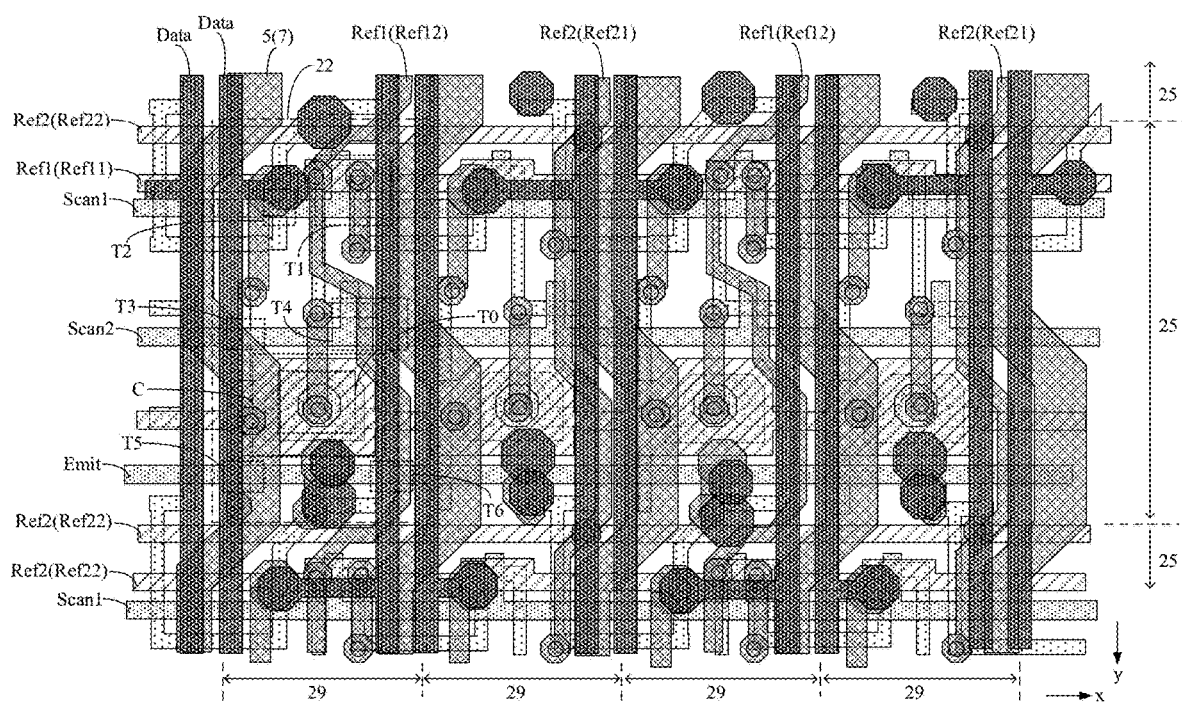
FIG. 25 is a structural schematic diagram of layers of a display panel according to another embodiment of the present disclosure.
Figure 26:
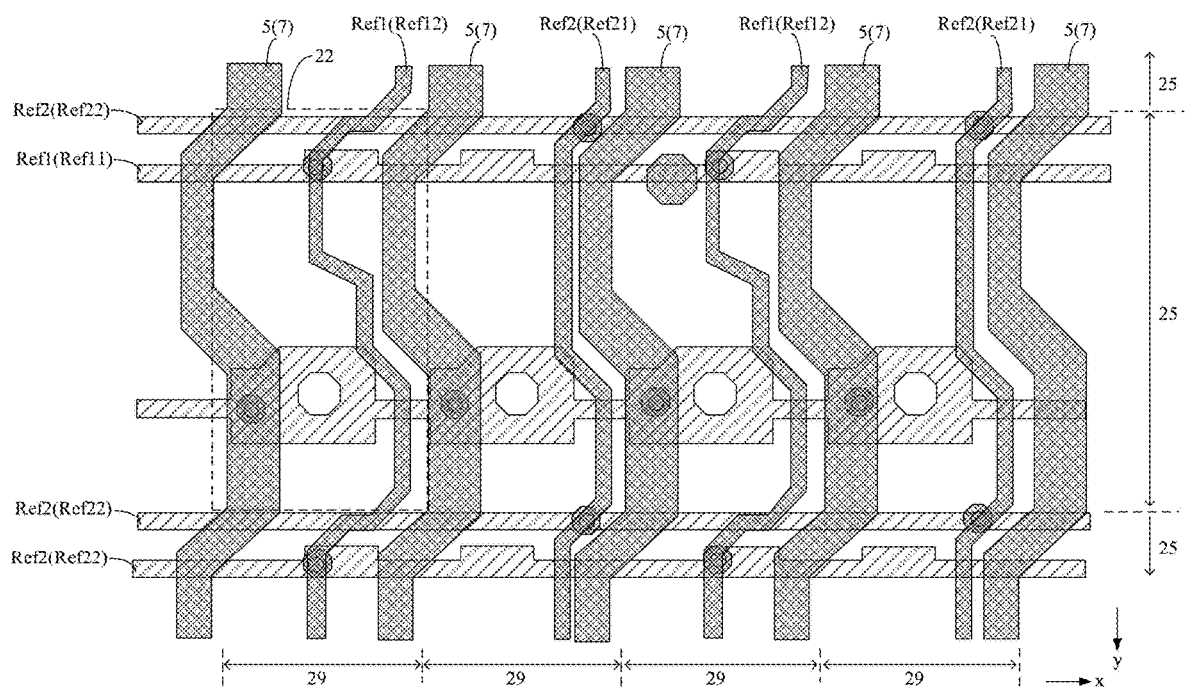
FIG. 26 is a partial structural schematic diagram of layers shown in FIG. 25 according to an embodiment of the present disclosure.

FIG. 25 is a structural schematic diagram of layers of a display panel according to another embodiment of the present disclosure. FIG. 26 is a partial structural schematic diagram of layers shown in FIG. 25. As shown in FIG. 25 and FIG. 26, based on the design in which different reset voltages are used to respectively reset the gate of the driving transistor T0 and the anode of the light-emitting element D, if an existing design on double reset lines is used, the first reset line includes a first reset sub-line Ref11 and a fourth reset sub-line Ref12. The second reset line Ref2 includes a second reset sub-line Ref21 and a third reset sub-line Ref22. Each pixel row 25 corresponds to one first reset sub-line Ref11 and one third reset sub-line Ref22. Each pixel column 29 corresponds to one fourth reset sub-line Ref12 or one second reset sub-line Ref21. The second reset sub-line Ref21 and the third reset sub-line Ref22 are crossed to form a grid structure. The first reset sub-line Ref11 and the third reset sub-line Ref22 are provided in a same layer. The fourth reset sub-line Ref12 and the second reset sub-line Ref21 are provided in a same layer.

Comparing FIG. 24 with FIG. 26, at least one of positions for originally providing the third reset sub-line Ref22 is not provided with the third reset sub-line Ref22, but provided with the second power line 24, or at least one of positions for originally providing the fourth reset sub-line Ref12 is not provided with the fourth reset sub-line Ref12, but provided with the third power line 28 in some embodiments of the present disclosure. In this way, the second power line 24 and/or the third power line 28 can be used to reduce the overall load of the power line 5, lower a voltage drop of the first power voltage transmitted on the power line 5, increase the consistency of first power voltage received by the pixel circuits 22 at different positions, and further improve the display uniformity of the display panel. Moreover, this does not additionally provide other metal layers to accommodate the second power line 24 and/or the third power line 28, and does not increase a number of wirings in the display panel. In addition, this can further ensure that there are still two reset lines to provide two reset voltages for the pixel circuits 22 normally.

In some embodiments of the present disclosure, referring to FIG. 21 and FIG. 24, the second reset line Ref2 further includes a third reset sub-line Ref22. The third reset sub-line Ref22 extends along the first direction x and is provided in a same layer as the first reset sub-line Ref11. The second wiring 27 corresponding to at least one of the pixel rows 25 is the third reset sub-line Ref22.

In some embodiments of the present disclosure, only at least one of positions for originally providing the third reset sub-line Ref22 is provided with the second power line 24, and a remaining position for originally providing the third reset sub-line Ref22 is still normally provided with the third reset sub-line Ref22. This can ensure that at least one of the transversely extending third reset sub-lines Ref22 crosses with the transversely extending second reset sub-line Ref21 to form a grid structure, so that the second reset line Ref2 still has a small load.

Figure 27:
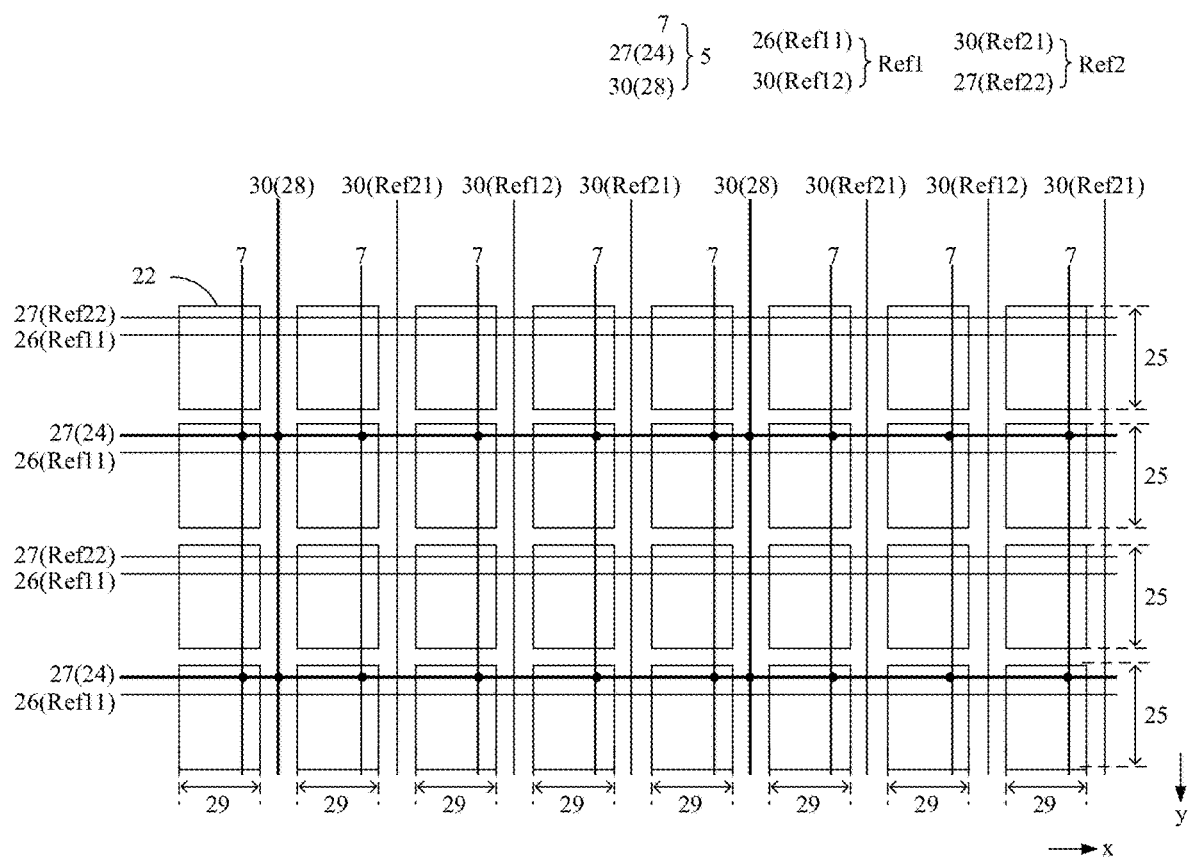
FIG. 27 is a schematic arrangement view of a reset line and a power line according to an embodiment of the present disclosure.

FIG. 27 is a schematic arrangement view of a reset line and a power line according to an embodiment of the present disclosure. Further, as shown in FIG. 27, adjacent ones of the second power lines 24 are spaced by at least one third reset sub-line Ref22, so that an enough number of the third reset sub-lines Ref22 can be kept in the display panel, optimizing load performance of the second reset line Ref2.

Further, referring to FIG. 27, in order to achieve a regular arrangement of the second power lines 24 and the third reset sub-lines Ref22, the second power lines 24 and the third reset sub-lines Ref22 may be arranged alternately.

Figure 28:
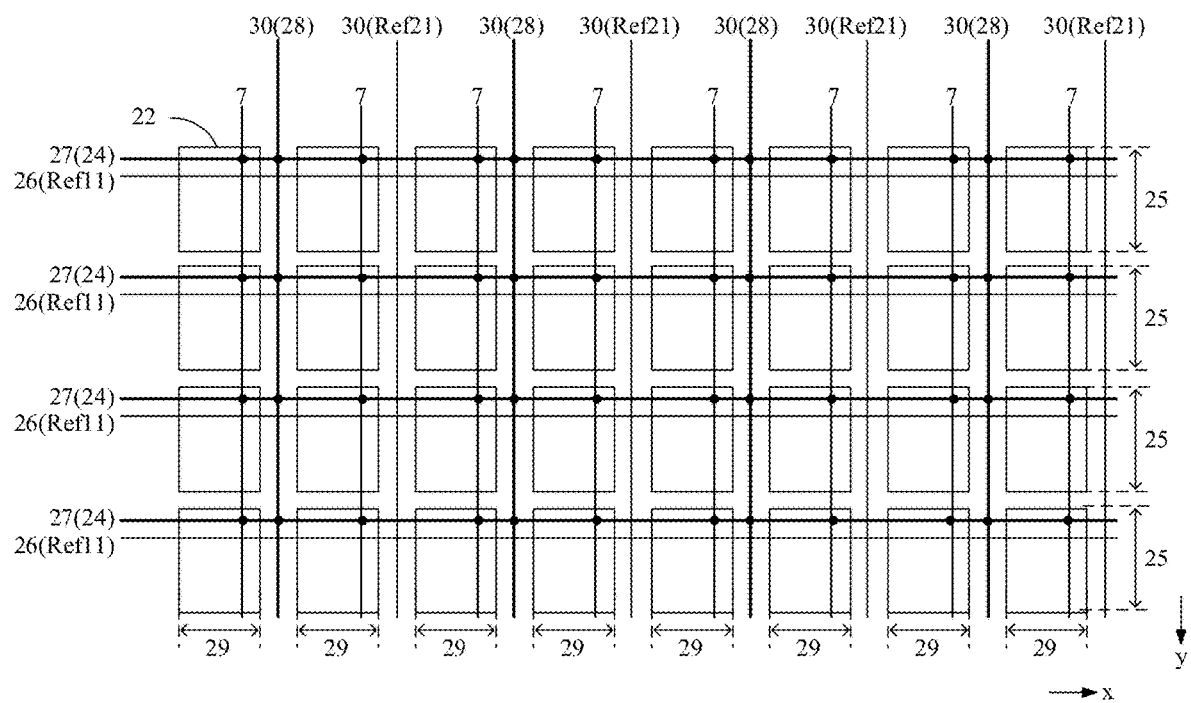
FIG. 28 is a schematic diagram of arrangement of reset lines and power lines according to another embodiment of the present disclosure.

FIG. 28 is a schematic diagram of arrangement of reset lines and power lines according to another embodiment of the present disclosure. In some embodiments of the present disclosure, as shown in FIG. 28, in order to further reduce the load of the power line 5, all of the positions for originally providing the third reset sub-line Ref22 may also be provided with the second power line 24. That is, the second wiring 27 corresponding to each of the pixel rows 25 is the second power line 24.

In some embodiments of the present disclosure, referring to FIG. 21 and FIG. 24, the first reset line further includes a fourth reset sub-line Ref12. The fourth reset sub-line Ref12 extends along the second direction y and is provided in a same layer as the second reset sub-line Ref21. The third wiring 30 corresponding to at least one of the pixel columns 29 is the fourth reset sub-line Ref12.

In some embodiments of the present disclosure, only at least one of positions for originally providing the fourth reset sub-line Ref12 is provided with the third power line 28, and a remaining position for originally providing the fourth reset sub-line Ref12 is still normally provided with the fourth reset sub-line Ref12. This can ensure that at least one of the longitudinally extending fourth reset sub-line Ref12 crosses with the transversely extended first reset sub-line Ref11 to form a grid structure in the display panel, so that the first reset line Ref1 still has a small load.

Further, referring to FIG. 27, adjacent ones of the third power lines 28 are spaced by at least one fourth reset sub-line Ref12. This can keep an enough number of the fourth reset sub-lines Ref12 in the display panel to optimize load performance of the first reset line Ref1.

In some embodiments of the present disclosure, referring to FIG. 28, in order to further reduce the load of the power line 5, all of the positions for originally providing the fourth reset sub-line Ref12 may also be provided with the third power line 28. That is, the second wiring 30 corresponding to the pixel column 29 is either the third power line 28 or the second reset sub-line Ref21.

Figure 29:
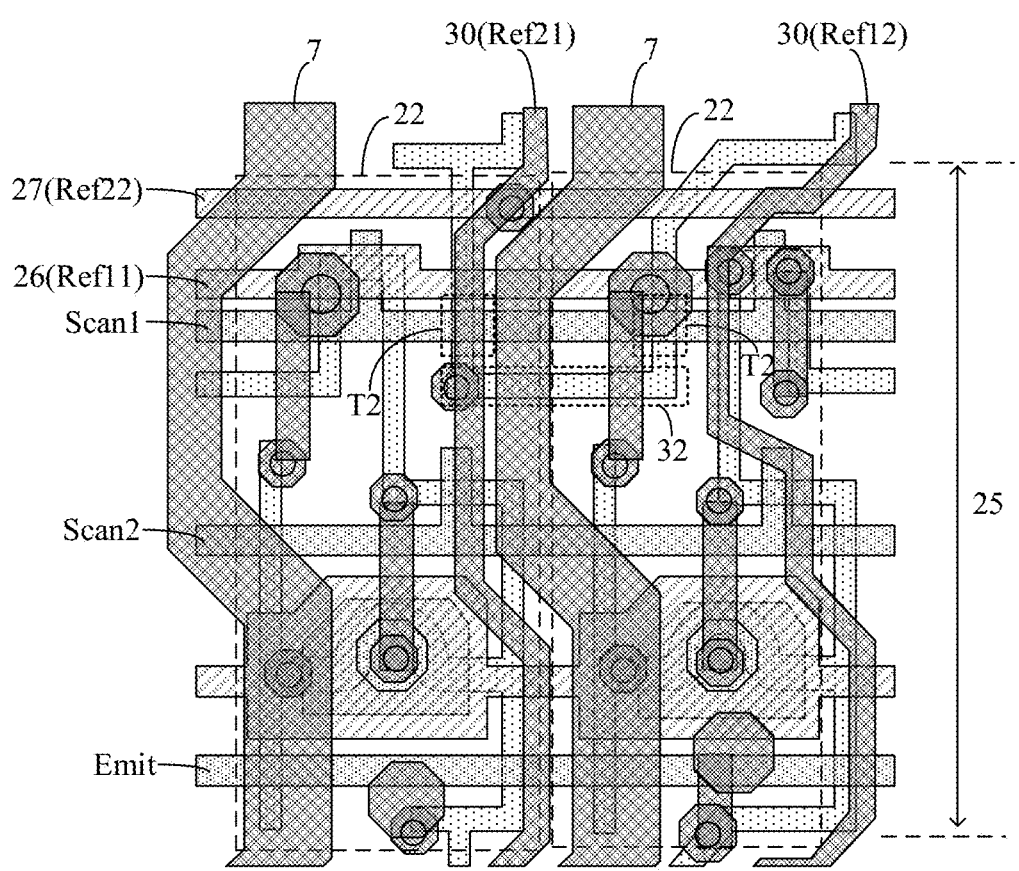
FIG. 29 is a partial structural schematic diagram of layers shown in FIG. 22 according to another embodiment of the present disclosure.

FIG. 29 is a partial structural schematic diagram of layers shown in FIG. 22 according to another embodiment of the present disclosure. In some embodiments of the present disclosure, as shown in FIG. 29, the pixel circuit 22 includes a second reset transistor T2. The second reset transistor T2 is electrically connected to the second reset line Ref2.

In the pixel row 25, the second reset transistors T2 in at least adjacent ones of the pixel circuits 22 are connected through a semiconductor connecting line 32. The second reset sub-line Ref21 is electrically connected to the semiconductor connecting line 32.

In some embodiments of the present disclosure, the second reset transistors T2 in the at least adjacent pixel circuits 22 are connected together through the semiconductor connecting line 32. When the second reset sub-line Ref21 is designed, the second reset sub-line Ref21 is directly connected to the semiconductor connecting line 32, thereby connecting the second reset transistors T2 in adjacent pixel circuits 22 to the second reset sub-line Ref21. This can simplify connection between the second reset sub-line Ref21 and the second reset transistor T2.

Figure 30:
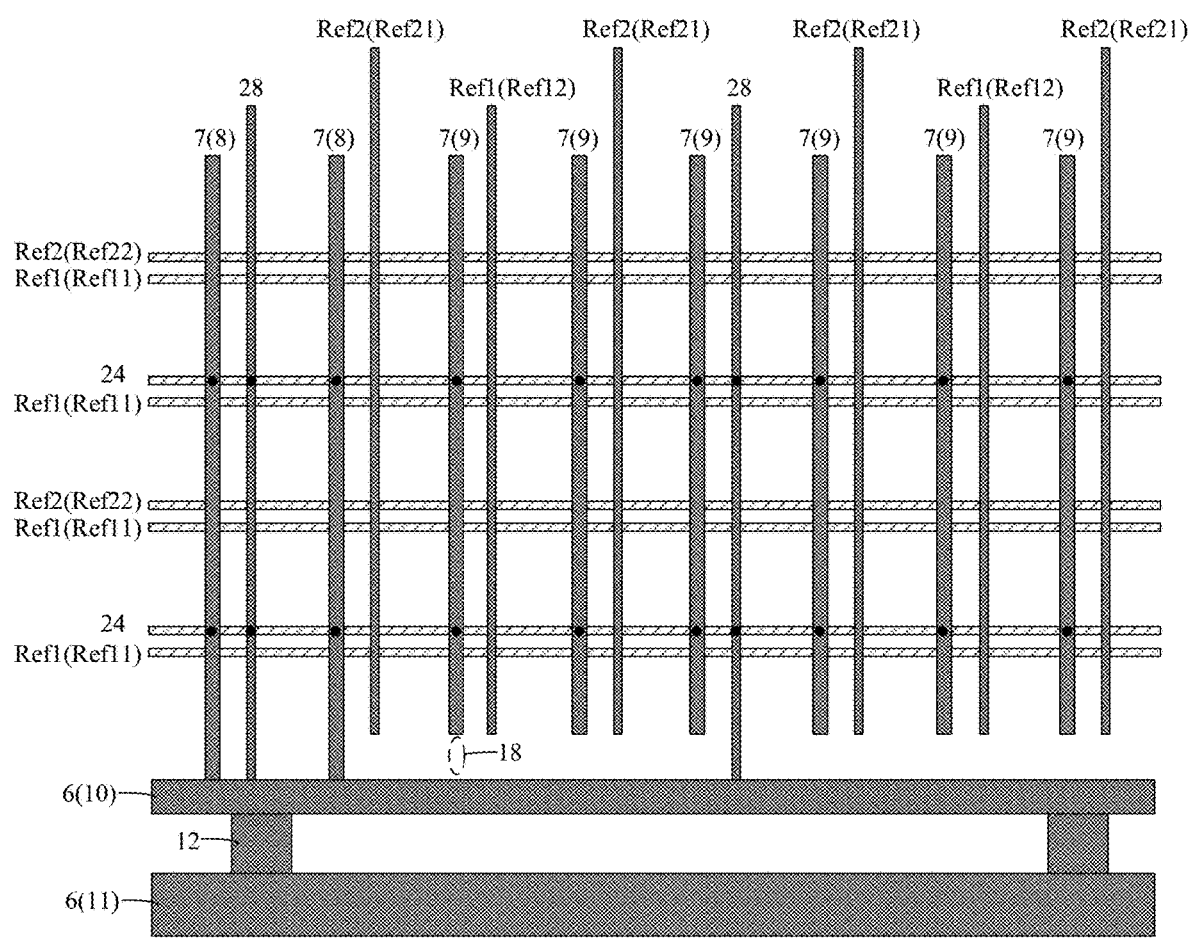
FIG. 30 is a schematic diagram of a reset line, a power line and a power bus according to an embodiment of the present disclosure.

FIG. 30 is a schematic diagram of a reset line, a power line 5 and a power bus 6 according to an embodiment of the present disclosure. In some embodiments of the present disclosure, as shown in FIG. 30, the power bus 6 includes a first bus 10 and a second bus 11. The first bus 10 is located between the display region 1 and the second bus 11. The first power sub-lines 8 are connected to the first bus 10. The breaks 18 are respectively formed between the second power sub-lines 9 and the first bus 10. The third power line 28 and the first bus 10 are provided in a same layer and are electrically connected. In this case, the third power line 28 can directly receive the first power voltage from the first bus 10, so that the second power sub-line 9 can further obtain the first power voltage from the third power line 28. Therefore, the second power sub-line 9 obtains the first power voltage more quickly.

In some embodiments of the present disclosure, referring to FIG. 21, FIG. 22 and FIG. 24, the pixel circuit 22 includes a driving transistor T0, a first reset transistor T1, and a second reset transistor T2. The first reset transistor T1 may be electrically connected to the first reset line and a gate of the driving transistor T0. The second reset transistor T2 may be electrically connected to the second reset line Ref2 and a light-emitting element D. That is, the first reset transistor T1 is a gate reset transistor. The first reset line is configured to provide a gate reset voltage. The second reset transistor T2 is an anode reset transistor. The second reset line Ref2 is configured to provide an anode reset voltage.

Figure 31:
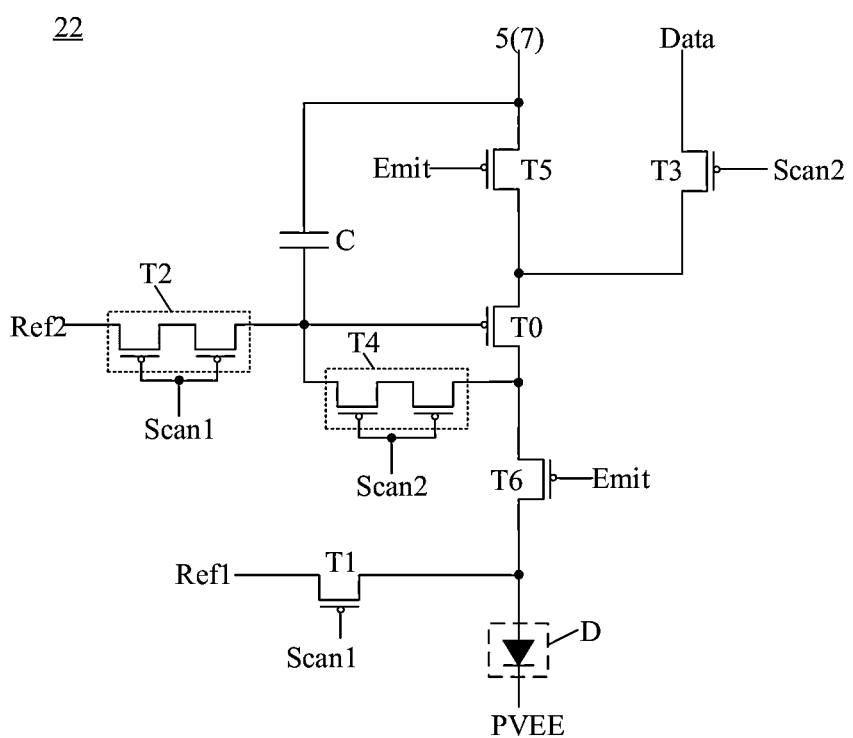
FIG. 31 is a structural schematic diagram of a pixel circuit according to another embodiment of the present disclosure.
Figure 32:
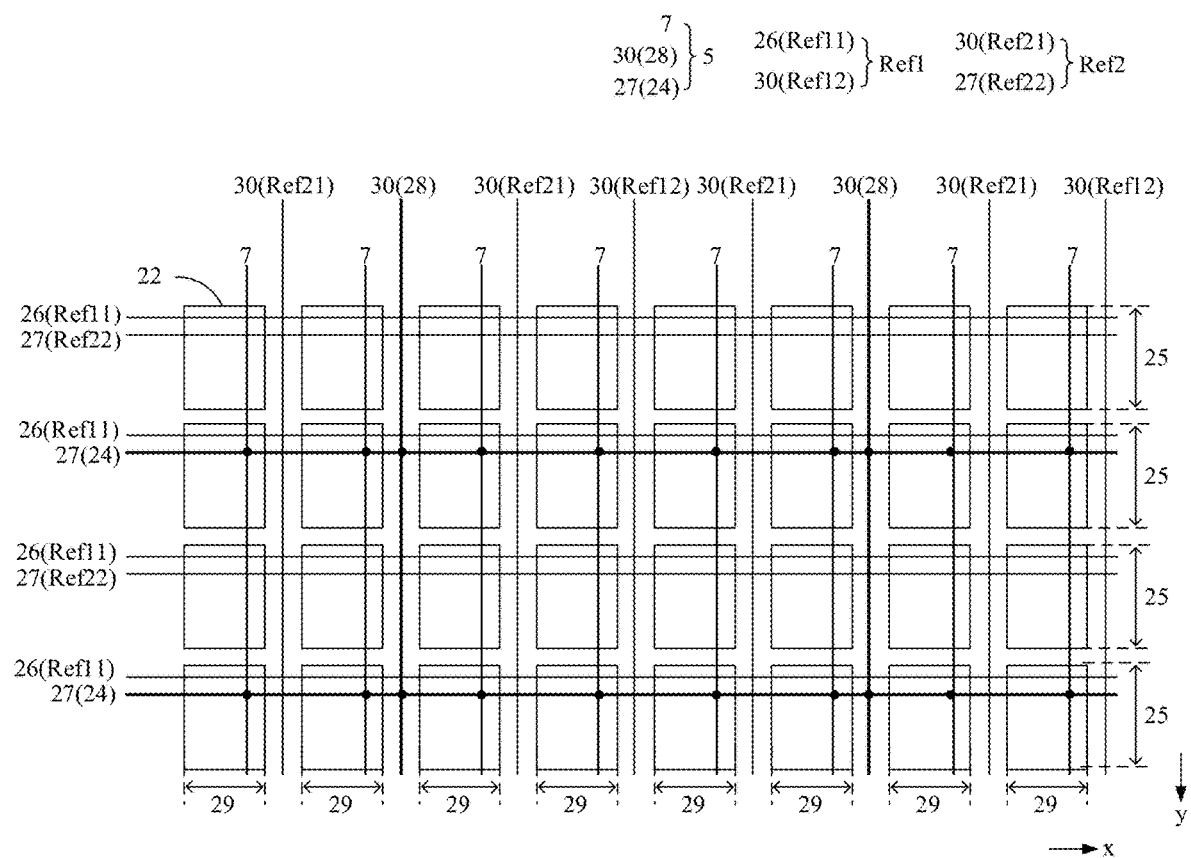
FIG. 32 is a schematic diagram of arrangement of reset lines and power lines according to an embodiment of the present disclosure.

In some embodiments of the present disclosure, as shown in FIG. 31 and FIG. 32, the pixel circuit 22 includes a driving transistor T0, a first reset transistor T1, and a second reset transistor T2. The first reset transistor T1 is electrically connected to the first reset line and a light-emitting element D. The second reset transistor T2 is electrically connected to the second reset line Ref2 and a gate of the driving transistor T0. FIG. 31 is a structural schematic diagram of a pixel circuit according to another embodiment of the present disclosure. FIG. 32 is a schematic diagram of arrangement of reset lines and power lines 5 according to an embodiment of the present disclosure. That is, the first reset transistor T1 is an anode reset transistor. The first reset line is configured to provide an anode reset voltage. The second reset transistor T2 is a gate reset transistor. The second reset line Ref2 is configured to provide a gate reset voltage.

It is found that compared with gate reset, anode reset has a direct impact on an anode voltage of the light-emitting element D, thereby affecting a brightness of the light-emitting element D. Therefore, the reset of anode affects the overall brightness uniformity of the display panel more directly and more significantly.

As can be seen from FIG. 26, in the existing design with the double reset lines, each pixel row 25 corresponds to one first reset sub-line Ref11 and one third reset sub-line Ref22, and each pixel column 29 only corresponds to one second reset sub-line Ref21 or one fourth reset sub-line Ref12. For the reset lines transmitting the same reset voltage, a number of the transverse reset sub-lines is usually greater than a number of the longitudinal reset sub-lines. In view of this, in the embodiments of the present disclosure, the first reset transistor T1 may be set as the anode reset transistor electrically connected to the light-emitting element D, and the first reset line may be set as the reset line for providing the anode reset voltage. Without changing the original transversely-extending first reset sub-line Ref11, at least one of the third reset sub-lines Ref22 is replaced by the second power line 24. In this way, there is a larger number of the transverse reset sub-lines in the anode reset line, and the anode reset line has better load performance.

It should be noted that a case where the fourth reset sub-line Ref12 and the second reset sub-line Ref21 extend along the second direction y in the embodiments of the present disclosure refers to that the fourth reset sub-line Ref12 and the second reset sub-line Ref21 extend in the second direction y as a whole. Although partially having a bending position, the fourth reset sub-line Ref12 and the second reset sub-line Ref21 extend along the second direction y as the whole.

Figure 33:
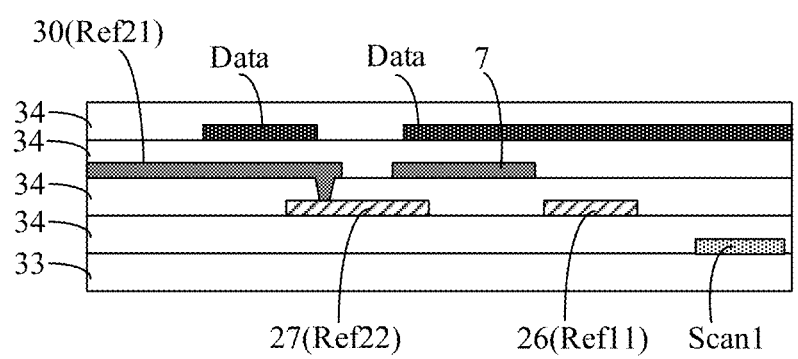
FIG. 33 is a sectional view along direction A1-A2 shown in FIG. 22 according to an embodiment of the present disclosure.

FIG. 33 is a sectional view along direction A1-A2 shown in FIG. 22. In some embodiments of the present disclosure, referring to FIG. 21 and FIG. 22, as shown in FIG. 33, the pixel circuit 22 is further electrically connected to a data line Data. The data line Data extends along the second direction y. A layer of the second reset sub-line Ref21 is located at a side of a layer of the first reset sub-line Ref11 adjacent to a light exit surface of the display panel. A layer of the data line Data is located at a side of the layer of the second reset sub-line Ref21 adjacent to the light exit surface of the display panel. In this case, the data line Data is adjacent to the light exit surface of the display panel, a longitudinal spacing between the data line Data and a signal line such as a first scanning line Scan1, a second scanning line Scan2 and a light-emitting control line Emit can be increased, and coupling between the data line Data and the signal line is reduced.

It can be understood that referring to FIG. 33, the display panel further includes a substrate 33 and multiple insulating layers 34, which is not repeated herein. The side adjacent to the light exit surface of the display panel is a side away from the substrate.

Further, referring to FIG. 22, in order to prolong charging time of the pixel circuits 22, the pixel circuits 22 in one pixel column 29 are respectively electrically connected to two data lines Data. An even row of the pixel circuits 22 in the pixel column 29 are electrically connected to one data line Data, and an odd row of the pixel circuits 22 in the pixel column 29 are electrically connected to one data line Data.

In some embodiments of the present disclosure, there is a large number of the data lines in the display panel. That is, there are many wires on the layer of the data line. If the second power line 24 and the third power line 28 are directly provided in the original layer of the display panel, a wiring space is insufficient. In the embodiments of the present disclosure, the second power line 24 is provided at the position for originally providing the third reset sub-line Ref22, and the third power line 28 is provided at the position for originally providing the fourth reset sub-line Ref12. This can desirably solve the problem that no enough space is provided to accommodate the second power line 24 and the third power line 28 in the double-data-line Data design, and optimizes display performance and layout design of the display panel with the double-data-line Data structure.

Figure 34:
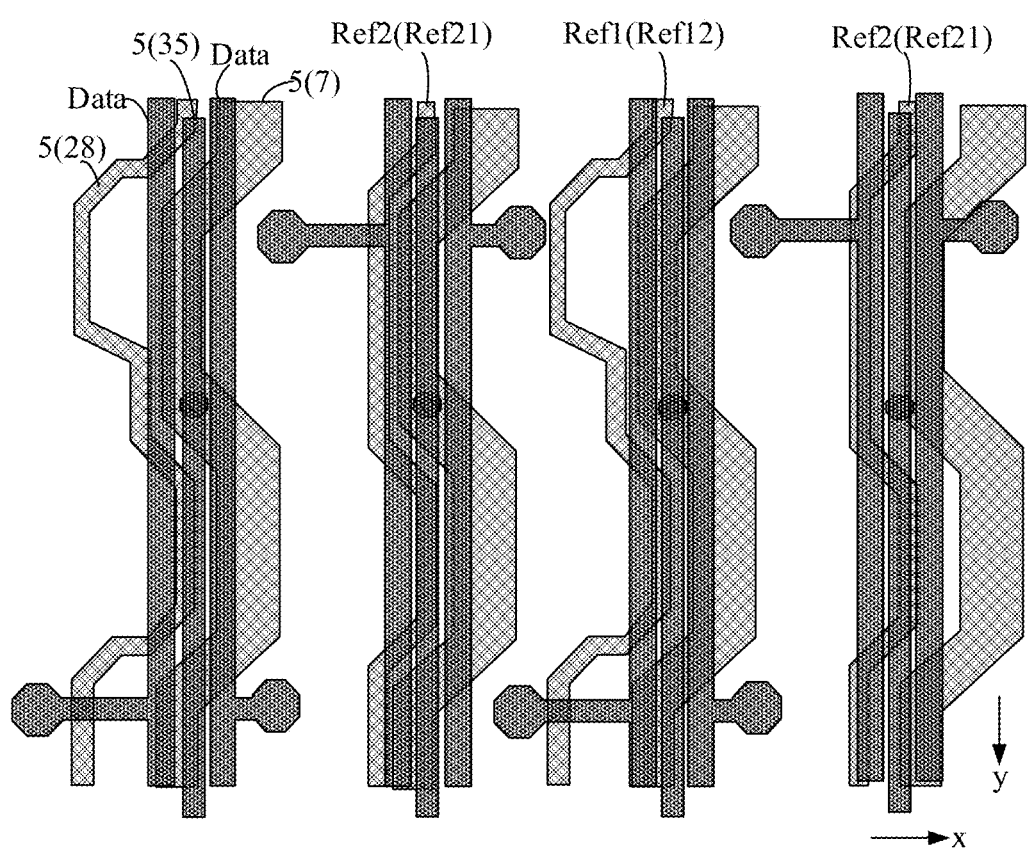
FIG. 34 is a partial structural schematic diagram of layers of a display panel according to an embodiment of the present disclosure.

FIG. 34 is a partial structural schematic diagram of layers of a display panel according to an embodiment of the present disclosure. If the layer of the data line Data has a certain wiring space, in some embodiments of the present disclosure, as shown in FIG. 34, the power line 5 may also include fourth power lines 35. The fourth power lines 35 are respectively electrically connected to the first power line 7. The fourth power line 35 extends along the second direction y and is provided in a same layer as the data line Data. This further reduces the load of the power line 5.

Figure 35:
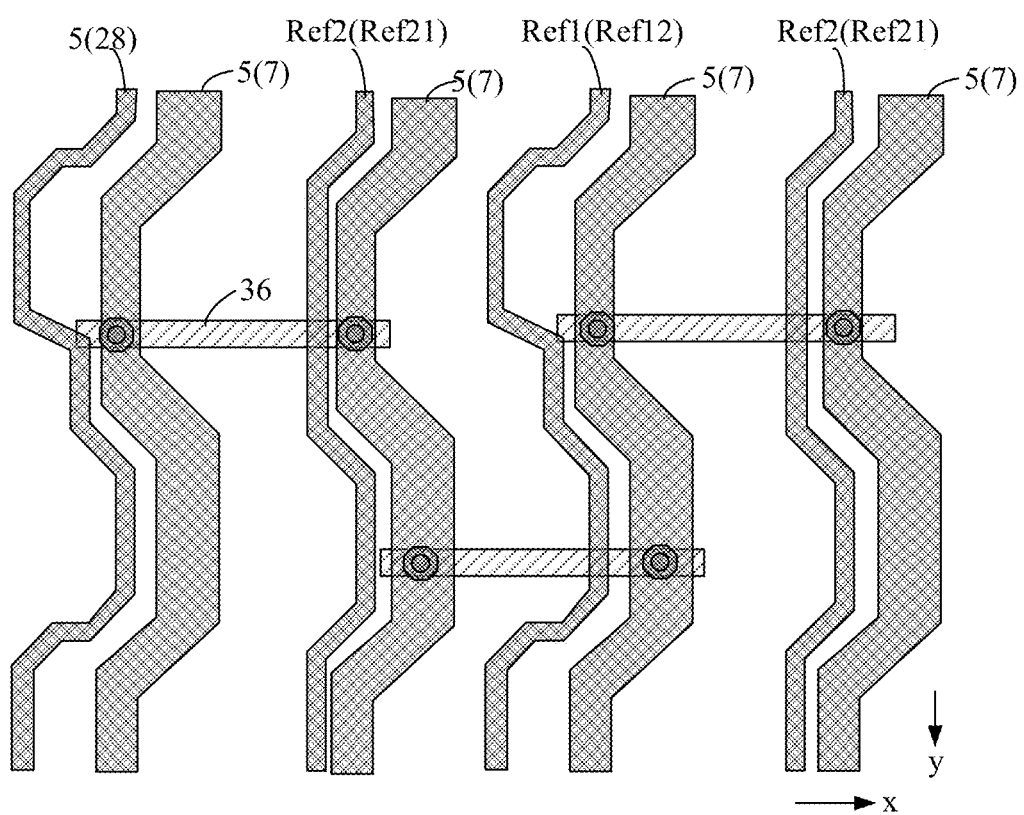
FIG. 35 is a partial structural schematic diagram of layers of a display panel according to another embodiment of the present disclosure.

FIG. 35 is a partial structural schematic diagram of layers of a display panel according to another embodiment of the present disclosure. In some embodiments of the present disclosure, as shown in FIG. 35, in order to further reduce the load of the power line 5, adjacent ones of the first power lines 7 are electrically connected through a connecting line 36. An extension direction of the connecting line 36 intersects with the second direction y. In some embodiments of the present disclosure, the connecting line 36 may be provided in a same layer as the first reset sub-line Ref11. Or, the connecting line 36 may be provided in a same layer as the first scanning line Scan1. Or, a layer of the connecting line 36 may also be located between a layer of the first scanning line Scan1 and the substrate.

Figure 36:
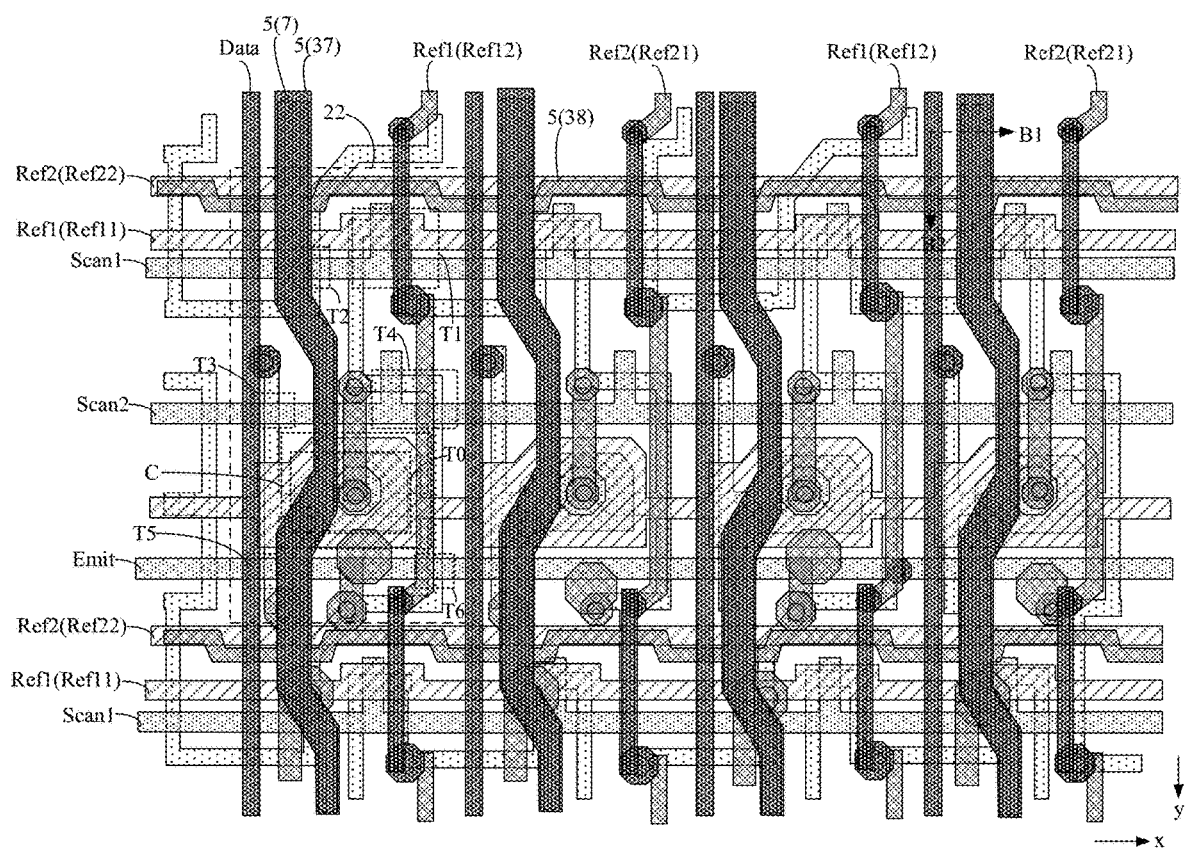
FIG. 36 is a structural schematic diagram of layers of a display panel according to another embodiment of the present disclosure.
Figure 37:
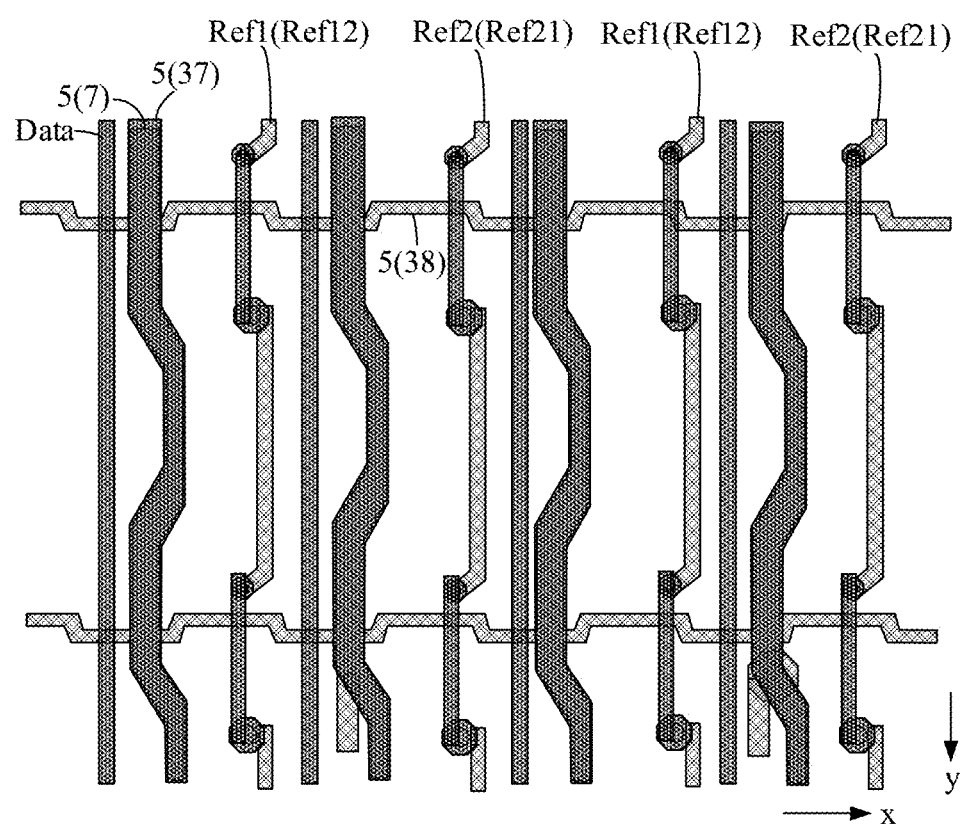
FIG. 37 is a partial structural schematic diagram of layers shown in FIG. 36 according to an embodiment of the present disclosure.
Figure 38:
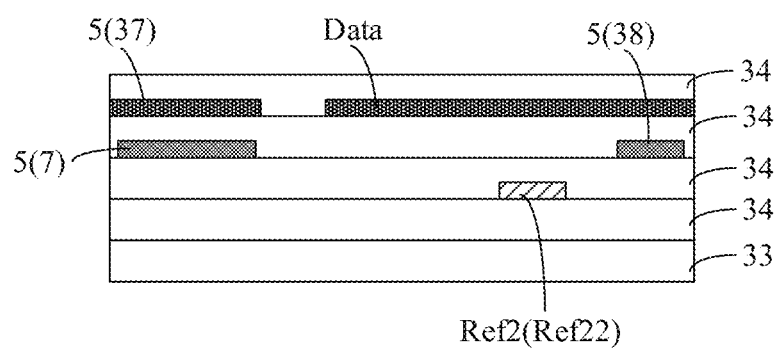
FIG. 38 is a sectional view along direction B1-B2 shown in FIG. 36 according to an embodiment of the present disclosure.

FIG. 36 is a structural schematic diagram of layers of a display panel according to another embodiment of the present disclosure. FIG. 37 is a partial structural schematic diagram of layers shown in FIG. 36. FIG. 38 is a sectional view along direction B1-B2 shown in FIG. 36. In some embodiments of the present disclosure, as shown in FIG. 36 to FIG. 38, the display panel further includes pixel circuits 22. The pixel circuits 22 are electrically connected to a data line Data. The data line Data extends along the second direction y.

The power line 5 further includes fifth power lines 37. The fifth power lines 37 are respectively electrically connected to the first power line 7. The fifth power line 37 extends along the second direction y. The fifth power line 37 is provided in a same layer as the data line Data. A layer of the fifth power line 37 is located at a side of a layer of the first power line 7 adjacent to a light exit surface of the display panel.

The power line 5 further includes sixth power lines 38. The sixth power lines 38 are respectively electrically connected to the first power line 7. An extension direction of the sixth power line 38 intersects with the second direction y. A layer of the sixth power line 38 is located at a side of the layer of the fifth power line 37 away from the light exit surface of the display panel.

In some embodiments of the present disclosure, the fifth power line 37 and the sixth power line 38 can be used to reduce the overall load of the power line 5. On the other hand, when a relative position relationship among the layer of the fifth power line 37, the layer of the sixth power line 38 and the layer of the data line Data is designed, by providing the fifth power line 37 and the data line Data at the side adjacent to the light exit surface of the display panel, the longitudinal spacing between the data line Data and the signal line such as the first scanning line Scan1, the second scanning line Scan2 and the light-emitting control line Emit can be increased, and the coupling between the data line Data and the signal line is reduced.

In some embodiments of the present disclosure, referring to FIG. 36 to FIG. 38, when the layer of the sixth power line 38 is located at the side of the layer of the fifth power line 37 away from the light exit surface of the display panel, the sixth power line 38 is provided in a same layer as the first power line 7. In this case, the sixth power line 38 and the first power line 7 are formed in a same patterning process, and are directly connected. Without forming a hole between the sixth power line and the first power line, the connection process is relatively simple.

Figure 39:
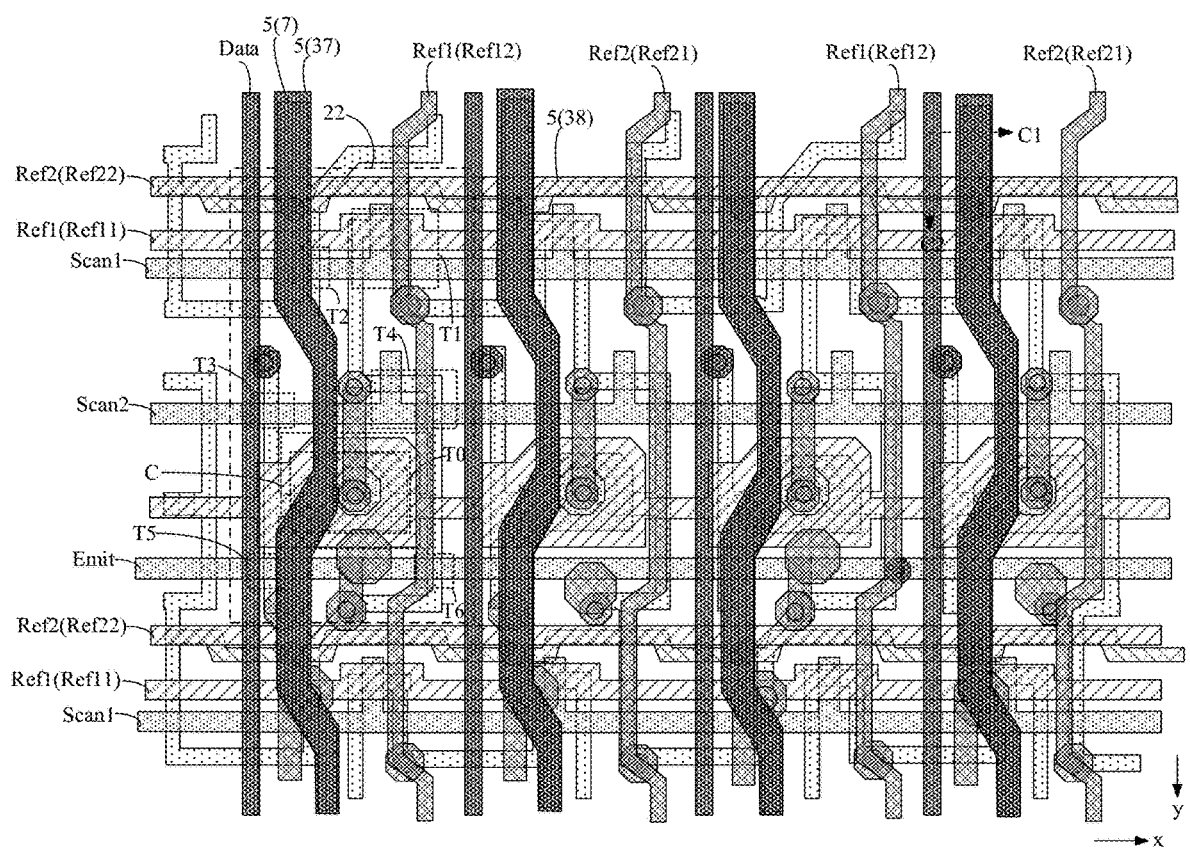
FIG. 39 is a structural schematic diagram of layers of a display panel according to another embodiment of the present disclosure.
Figure 40:
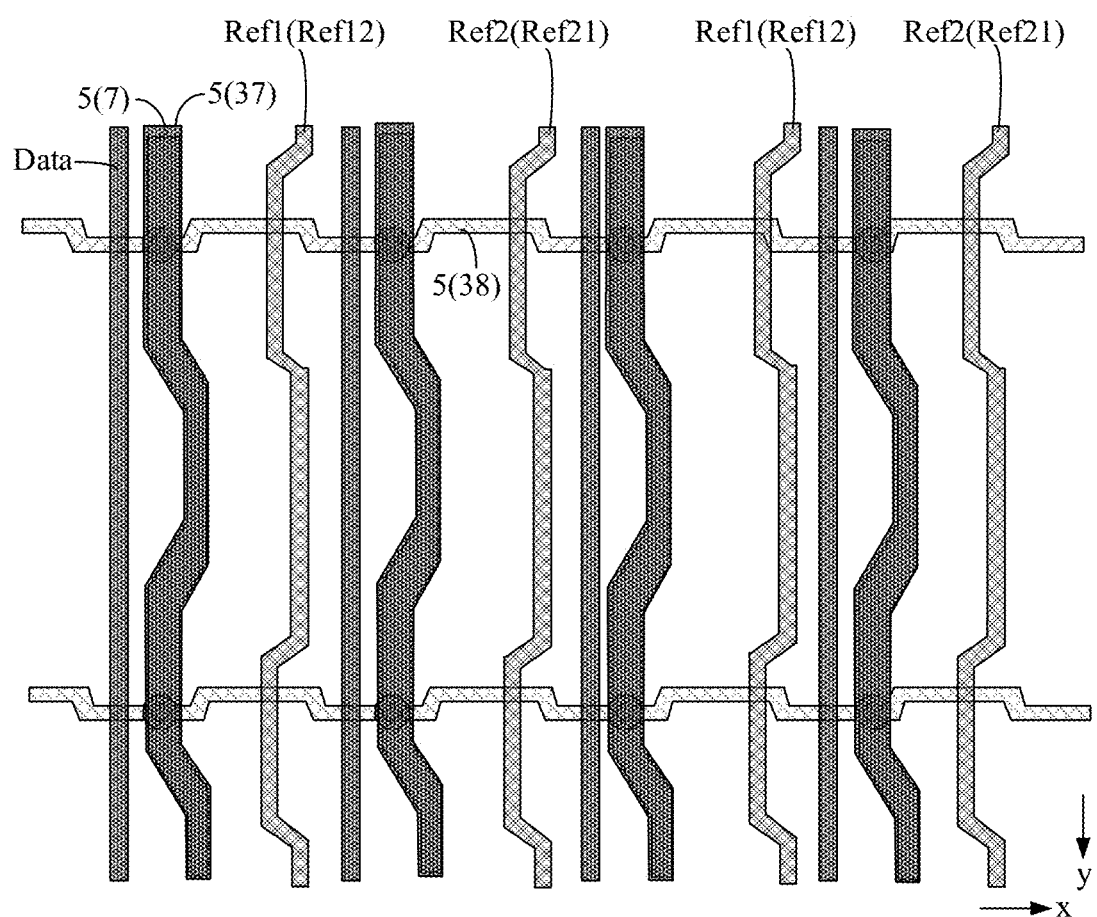
FIG. 40 is a partial structural schematic diagram of layers shown in FIG. 39 according to an embodiment of the present disclosure.
Figure 41:
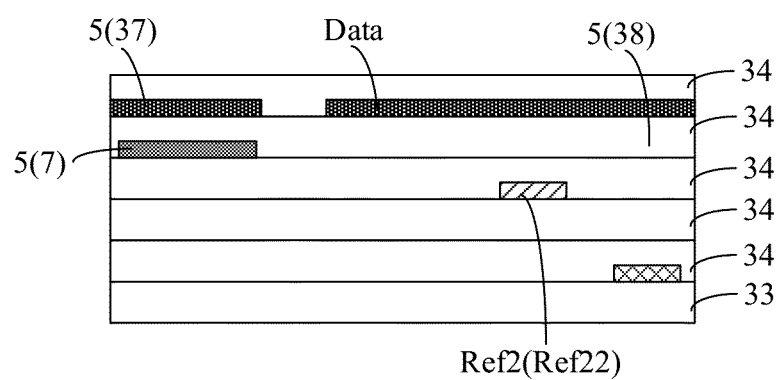
FIG. 41 is a sectional view along direction C1-C2 shown in FIG. 38 according to an embodiment of the present disclosure.

FIG. 39 is a structural schematic diagram of layers of a display panel according to another embodiment of the present disclosure. FIG. 40 is a partial structural schematic diagram of layers shown in FIG. 39. FIG. 41 is a sectional view along direction C1-C2 shown in FIG. 39. In some embodiments of the present disclosure, as shown in FIG. 39 to FIG. 41, when the layer of the sixth power line 38 is located at the side of the layer of the fifth power line 37 away from the light exit surface of the display panel, the layer of the sixth power line 38 is located at a side of the layer of the first power line 7 away from the light exit surface of the display panel.

In some embodiments of the present disclosure, the sixth power line 38 may be provided in a same layer as the first reset sub-line Ref11. Or, the sixth power line 38 may also be provided in a same layer as the first scanning line Scan1. Or, the layer of the sixth power line 38 may also be located between the layer of the first scanning line Scan1 and the substrate.

In some embodiments of the present disclosure, the sixth power line 38 is not provided in a same layer as the first power line 7, so the sixth power line 38 is not conflicted with the fourth reset sub-line Ref12 and the second reset sub-line Ref21, and the fourth reset sub-line Ref12 and the second reset sub-line Ref21 are not provided with a cross bridge to avoid the sixth power line 38, thereby lowering a process difficulty.

Figure 42:
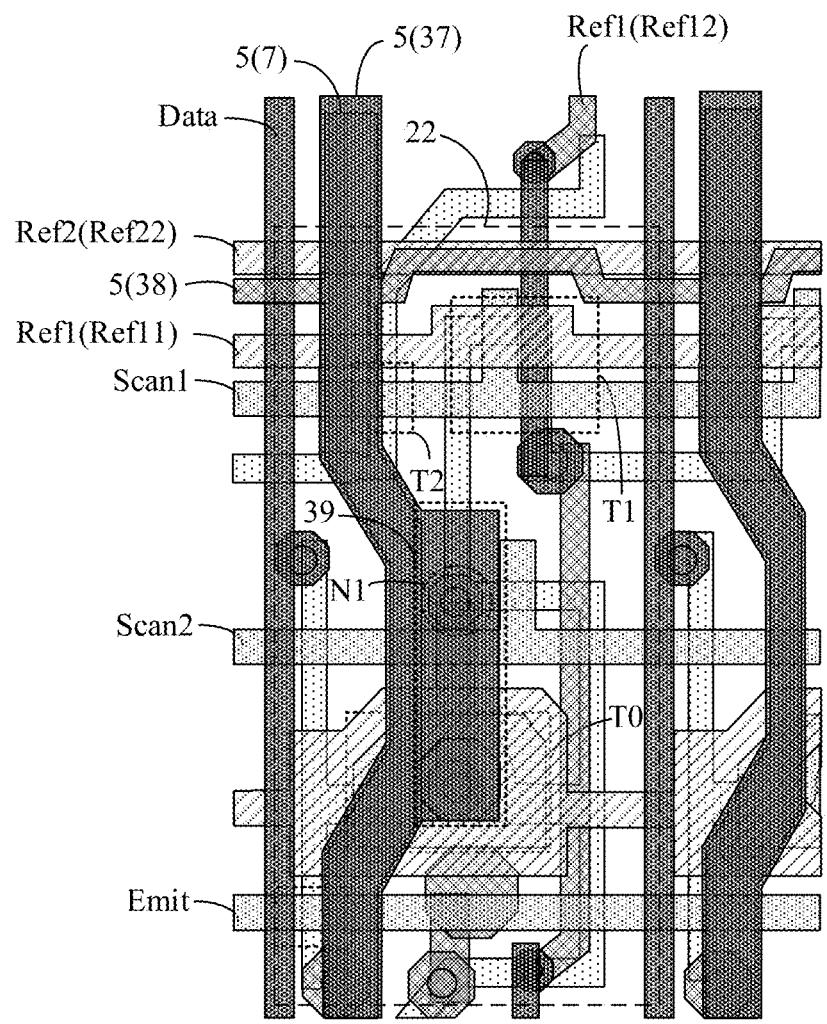
FIG. 42 is a structural schematic diagram of layers of a display panel according to another embodiment of the present disclosure.

FIG. 42 is a structural schematic diagram of layers of a display panel according to another embodiment of the present disclosure. In some embodiments of the present disclosure, as shown in FIG. 42, the pixel circuit 22 further includes a driving transistor T0. A gate of the driving transistor T0 is electrically connected to a first node N1. The first node N1 may be connected between the gate of the driving transistor T0 and the second reset transistor T2.

The fifth power line 37 includes a protrusion 39. In a direction perpendicular to a plane of the display panel, the protrusion 39 at least partially overlaps with the first node N1. The protrusion 39 is used to stabilize a potential of the first node N1, thereby improving the stability of the driving transistor T0.

In some embodiments of the present disclosure, referring to FIG. 42, in a direction perpendicular to a plane of the display panel, the fifth power line 37 at least partially overlaps with the first power line 7. On one hand, this can reduce an overall space for the fifth power line and the first power line in the first direction x, and optimize the layer design of the display panel. On the other hand, a hole can be formed directly between the fifth power line 37 and the first power line 7, so the connection is simpler.

In addition, referring to FIG. 21 and FIG. 31, the pixel circuit 22 may further include: a data writing transistor T3, a compensating transistor T4, a first light emission control transistor T5, and a second light emission control transistor T6.

The data writing transistor T3 includes a gate electrically connected to the second scanning signal line Scan2, a first terminal electrically connected to the data line Data, and a second terminal electrically connected to a first terminal of the driving transistor T0.

The compensating transistor T4 includes a gate electrically connected to the second scanning signal line Scan2, a first terminal electrically connected to a second terminal of the driving transistor T0, and a second terminal electrically connected to the gate of the driving transistor T0.

The first light emission control transistor T5 includes a gate electrically connected to a light emission control line Emit, a first terminal electrically connected to the power line 5, and a second terminal electrically connected to the first terminal of the driving transistor T0.

The second light emission control transistor T6 includes a gate electrically connected to the light emission control line Emit, a first electrode electrically connected to the second terminal of the driving transistor T0, and a second terminal electrically connected to the anode of the light-emitting element D.

The working principle of the pixel circuit 22 is the same as that in the related art, and details are not repeated herein.

Figure 43:
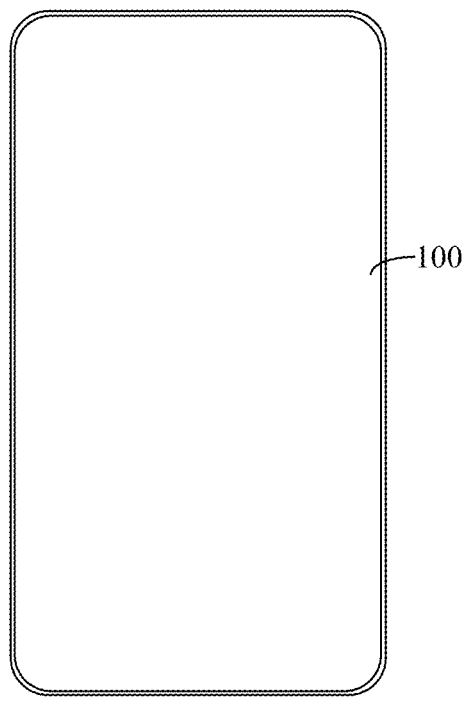
FIG. 43 is a structural schematic diagram of a display apparatus according to an embodiment of the present disclosure.

Based on the same inventive concept, the embodiments of the present disclosure further provide a display apparatus. FIG. 43 is a structural schematic diagram of a display apparatus according to an embodiment of the present disclosure. As shown in FIG. 43, the display apparatus includes the foregoing display panel 100. A specific structure of the display panel 100 has been described in detail in the foregoing embodiments. Details are not repeated herein. The display apparatus shown in FIG. 43 is for schematic description only. The display apparatus may be any electronic device with a display function, such as a mobile phone, a tablet computer, a laptop computer, an e-book, or a television.

The above are merely exemplary embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various modifications, readjustments, and substitutions without departing from the scope of the present disclosure.

What is claimed is:

1. A display panel, comprising:
a display region and a non-display region;
power lines located in the display region, wherein the power lines comprise first power lines extending along a second direction and arranged in a same layer, and the second direction intersects with a first direction; and
pixel circuits,
wherein one of the pixel circuits is electrically connected to a first reset line for providing a first reset voltage and a second reset line for providing a second reset voltage;
the first reset line comprises a first reset sub-line extending along the first direction, and the second reset line comprises a second reset sub-line extending along the second direction;
the power lines further comprise second power lines electrically connected to the first power lines, the second power line extends along the first direction and is provided in a same layer as the first reset sub-line, the display panel comprises pixel rows arranged long the second direction, one of the pixel rows comprises pixel circuits arranged along the first direction, the pixel row comprises a first wiring and a second wiring that are provided in a same layer, the first wiring corresponding to the pixel row is the first reset sub-line, and the second wiring corresponding to at least one of the pixel rows is the second power line; and/or
the power lines further comprise third power lines electrically connected to the first power lines, the third power lines extend along the second direction and are provided in a same layer as the second reset sub-line, the display panel comprises pixel columns arranged along the first direction, one of the pixel columns comprises pixel circuits arranged along the second direction, one of the pixel columns comprises a third wiring, the third wiring corresponding to one of the pixel columns is the second reset sub-line, and the third wiring corresponding to another one of the pixel columns is the third power line.

2. The display panel according to claim 1, wherein the second reset line further comprises a third reset sub-line, the third reset sub-line extends along the first direction and is provided in a same layer as the first reset sub-line, and the second wiring in at least one of the pixel rows is the third reset sub-line.

3. The display panel according to claim 2, wherein adjacent ones of the second power lines are spaced by at least one third reset sub-line.

4. The display panel according to claim 1, wherein the first reset line further comprises a fourth reset sub-line, the fourth reset sub-line extends along the second direction and is provided in a same layer as the second reset sub-line, and the third wiring in at least one of the pixel columns is the fourth reset sub-line.

5. The display panel according to claim 4, wherein adjacent ones of the third power lines are spaced by at least one fourth reset sub-line.

6. The display panel according to claim 1, wherein one of the pixel circuits comprises a second reset transistor electrically connected to the second reset line; and in one of the pixel rows, the second reset transistors in at least adjacent ones of the pixel circuits are connected through a semiconductor connecting line, and the second reset sub-line is electrically connected to the semiconductor connecting line.

7. The display panel according to claim 1, wherein one of the pixel circuits comprises a driving transistor, a first reset transistor, and a second reset transistor; the first reset transistor is electrically connected to the first reset line and a light-emitting element; and the second reset transistor is electrically connected to the second reset line and a gate of the driving transistor.

8. The display panel according to claim 1, wherein the pixel circuit is further electrically connected to a data line, and the data line extends along the second direction; and
   a layer of the second reset sub-line is located at a side of a layer of the first reset sub-line adjacent to a light exit surface of the display panel, and a layer of the data line is located at a side of the layer of the second reset sub-line adjacent to the light exit surface of the display panel.

9. A display apparatus, comprising a display panel, wherein the display panel comprises:
   a display region and a non-display region;
   power lines located in the display region, wherein the power lines comprise first power lines extending along a second direction and arranged in a same layer, and the second direction intersects with a first direction; and
   pixel circuits,
   wherein one of the pixel circuits is electrically connected to a first reset line for providing a first reset voltage and a second reset line for providing a second reset voltage;
   the first reset line comprises a first reset sub-line extending along the first direction, and the second reset line comprises a second reset sub-line extending along the second direction;
   the power lines further comprise second power lines electrically connected to the first power lines, the second power line extends along the first direction and is provided in a same layer as the first reset sub-line, the display panel comprises pixel rows arranged long the second direction, one of the pixel rows comprises pixel circuits arranged along the first direction, the pixel row comprises a first wiring and a second wiring that are provided in a same layer, the first wiring corresponding to the pixel row is the first reset sub-line, and the second wiring corresponding to at least one of the pixel rows is the second power line; and/or
   the power lines further comprise third power lines electrically connected to the first power lines, the third power lines extend along the second direction and are provided in a same layer as the second reset sub-line, the display panel comprises pixel columns arranged along the first direction, one of the pixel columns comprises pixel circuits arranged along the second direction, one of the pixel columns comprises a third wiring, the third wiring corresponding to one of the pixel columns is the second reset sub-line, and the third wiring corresponding to another one of the pixel columns is the third power line.

10. The display panel according to claim 1, further comprising power buses, wherein the power buses comprise a first bus and a second bus, the first bus is located between the display region and the second bus; and
   the first power lines comprise first power sub-lines and second power sub-lines, the first power sub-lines are connected to the power buses, breaks are formed between the second power sub-lines and the power buses, and the third power lines are electrically connected to the first bus.

11. The display panel according to claim 8, wherein the pixel circuits in one of the pixel columns are electrically connected to two data lines.

12. The display panel according to claim 11, wherein the power line further comprises a fourth power line electrically connected to the first power line, the fourth power line extends along the second direction and is arranged on a same layer as the data line.

\* \* \* \* \*